(12) United States Patent
Yamano et al.

(10) Patent No.: US 7,749,889 B2
(45) Date of Patent: Jul. 6, 2010

(54) MANUFACTURING METHOD OF SEMICONDUCTOR DEVICE

(75) Inventors: Takaharu Yamano, Nagano (JP); Tadashi Arai, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 11/856,360

(22) Filed: Sep. 17, 2007

(65) Prior Publication Data

US 2008/0076207 A1    Mar. 27, 2008

(30) Foreign Application Priority Data

Sep. 26, 2006 (JP) .............................. 2006-260948

(51) Int. Cl.
*H01L 21/44* (2006.01)

(52) U.S. Cl. ..................... 438/617; 438/612; 438/614

(58) Field of Classification Search ................. 257/778, 257/737, 738, 772, 773, 775, 747, 787, 788; 438/108–127, 455–465, 612–624
See application file for complete search history.

(56) References Cited

U.S. PATENT DOCUMENTS

| 4,503,112 | A | | 3/1985 | Konicek | |
|---|---|---|---|---|---|
| 5,517,752 | A | * | 5/1996 | Sakata et al. | ............ 29/832 |
| 2002/0056906 | A1 | * | 5/2002 | Kajiwara et al. | ......... 257/697 |
| 2003/0183947 | A1 | * | 10/2003 | Ohuchi | ..................... 257/778 |
| 2003/0186484 | A1 | | 10/2003 | Saijo et al. | |
| 2004/0115868 | A1 | * | 6/2004 | Ono | ......................... 438/127 |

FOREIGN PATENT DOCUMENTS

| EP | 0 734 065 | | 9/1996 |
|---|---|---|---|
| EP | 1 291 906 | | 3/2003 |
| JP | 10-335528 | | 12/1998 |
| JP | 11-251365 | | 9/1999 |
| JP | 2002-110854 | | 4/2002 |
| JP | 2002110854 | A * | 4/2002 |
| JP | 2004-193297 | | 7/2004 |
| JP | 3614828 | | 11/2004 |

* cited by examiner

*Primary Examiner*—Dung A. Le
(74) *Attorney, Agent, or Firm*—Rankin, Hill & Clark LLP

(57) ABSTRACT

The present invention relates to a manufacturing method of a semiconductor device having a size approximately same as the size of a semiconductor chip when viewed in a plan view, in which the semiconductor chip is flip-chip bonded to a wiring pattern, and an object of the invention is to provide the manufacturing method of a semiconductor device which allows reduction in the number of process steps to realize the minimization of manufacturing cost. An insulating resin 13 is formed so as to cover a plurality of internal connection terminals 12 and a surface of a plurality of semiconductor chips 11 on which the plurality of internal connection terminals are provided, then a metal layer 33 for forming a wiring pattern is formed over the insulating resin 13, and by pressing the metal layer 33, the metal layer 33 and the plurality of internal connection terminals 12 are pressure-bonded.

20 Claims, 44 Drawing Sheets

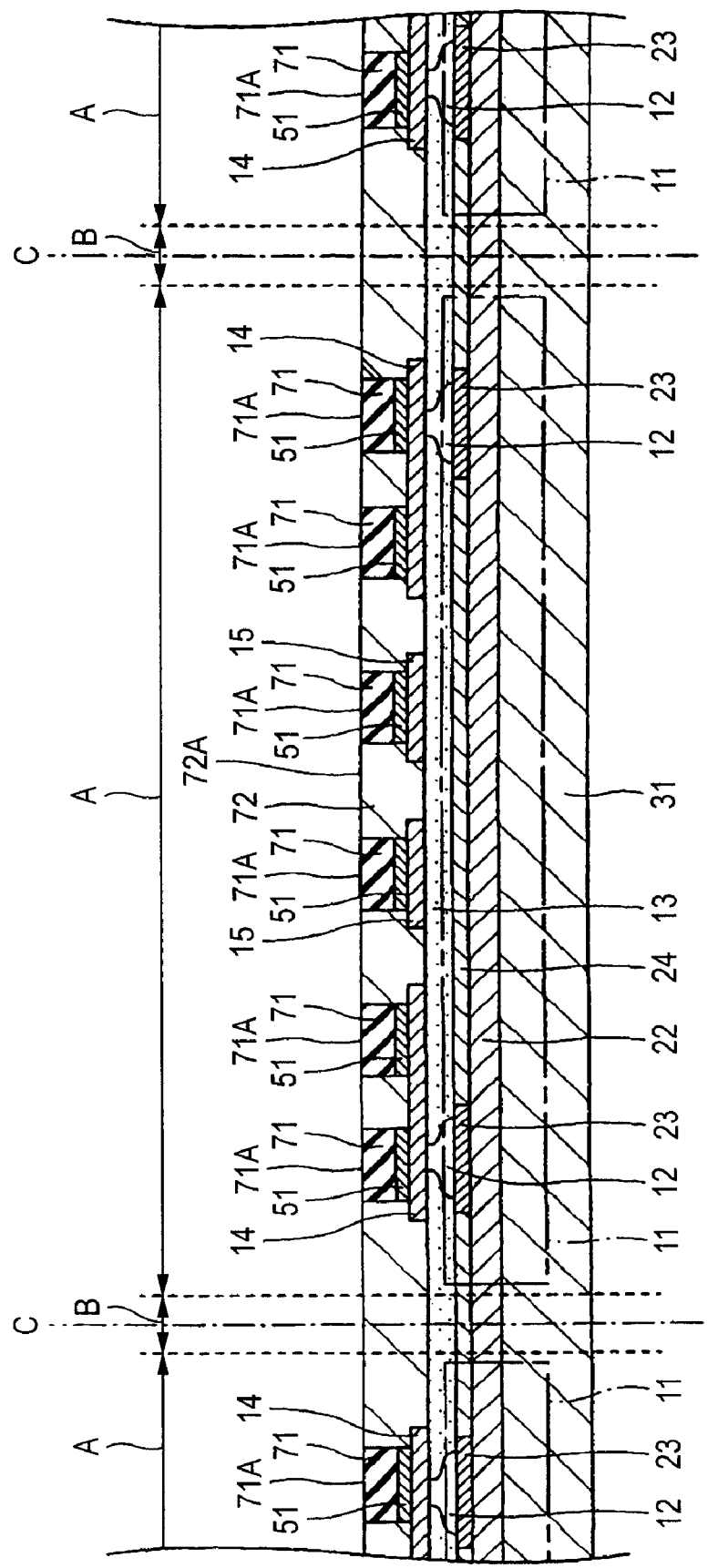

MANUFACTURING METHOD OF SEMICONDUCTOR DEVICE

BACKGROUND OF THE INVENTION

The present invention relates to a manufacturing method of a semiconductor device, and to a manufacturing method of a semiconductor device which has a size approximately same as a semiconductor chip when viewed in a plan view, and in which the semiconductor chip is flip-chip bonded to a wiring pattern.

Among conventional semiconductor devices, there is a semiconductor device, called a chip-size package (see FIG. 1, for example) which is made in almost the same size as the size of a semiconductor chip when viewed in a plan view.

FIG. 1 is a cross-sectional view of a conventional semiconductor device.

With reference to FIG. 1, a conventional semiconductor device 100 includes a semiconductor chip 101, internal connection terminals 102, a resin layer 103, a wiring pattern 104, a solder mask 106, and external connection terminals 107.

The semiconductor chip 101 includes a semiconductor substrate 110 which has been thinned, a semiconductor integrated circuit 111, a plurality of electrode pads 112 and a protective film 113. The semiconductor integrated circuit 111 is provided on the top surface of the semiconductor substrate 110. The semiconductor integrated circuit 111 includes a diffused layer(s), insulating layer(s), via(s) and wire(s) and the like. The plurality of electrode pads 112 are provided over the semiconductor integrated circuit 111. The plurality of electrode pads 112 are electrically connected to the wires provided on the semiconductor integrated circuit 111. The protective film 113 is provided over the semiconductor integrated circuit 111. The protective film 113 is a film for protecting the semiconductor integrated circuit 111.

The Internal connection terminals 102 are provided on the electrode pads 112. The top ends of the internal connection terminals 102 are exposed from the resin layer 103. The top ends of the internal connection terminals 102 are connected to the wiring pattern 104. The resin layer 103 is provided so as to cover the surface of the semiconductor chip 101 on which the internal connection terminals 102 are provided.

The wiring pattern 104 is provided on the resin layer 103. The wiring pattern 104 is connected to the internal connection terminals 102. The wiring pattern 104 is electrically connected to the electrode pads 112 via the internal connection terminals 102. The wiring pattern 104 has external connection terminal formation regions 104A on which the external connection terminals 107 are provided. The solder mask 106 is provided over the resin layer 103 so as to cover a portion of the wiring pattern 104 other than the external connection terminal formation regions 104A.

FIGS. 2 through 10 show manufacturing steps of the conventional semiconductor device. In FIGS. 2 through 10, identical constituents are denoted by the same reference numerals as in the conventional semiconductor device 100 shown in FIG. 1.

First, in a process step shown in FIG. 2, over the semiconductor substrate 110 which has not yet been thinned, the semiconductor chip 101 including the semiconductor integrated circuit 111, the plurality of electrode pads 112 and the protective film 113 is formed. Next, in a process step shown in FIG. 3, the internal connection terminals 102 are formed on the plurality of the electrode pads 112. At this point of time, the plurality of internal connection terminals 102 vary in their heights.

Next, in a process step shown in FIG. 4, a flat plate 115 is pressed against the plurality of internal connection terminals 102 to align the heights of the internal connection terminals 102. Then, in the step shown in FIG. 5, the resin layer 103 is formed so as to cover the internal connection terminals 102 and a surface of the semiconductor chip 101 on which the internal connection terminals 102 are formed.

Next, in a process step shown in FIG. 6, the resin layer 103 is ground until the top surfaces 102A of the internal connection terminals 102 are exposed from the resin layer 103. At this point of time, the grinding is done so as to make the top surface 103A of the resin layer 103 approximately flush with the top surfaces 102A of the internal connection terminals 102.

Next, in a process step shown in FIG. 7, the wiring pattern 104 is formed over the top surface 103A of the resin layer 103. Next, in a step shown in FIG. 8, the solder mask 106 is formed on the resin layer 103 so as to cover the portion of the wiring pattern 104 other than the external connection terminal formation regions 104A.

Next, in a process step shown in FIG. 9, the semiconductor substrate 110 is ground from the bottom side of the semiconductor substrate 110 to make the semiconductor substrate 110 thinner. Next, in a process step shown in FIG. 10, the external connection terminals 107 are formed over the external connection terminal formation regions 104A. In this way, the semiconductor device 100 is completed (see the Patent Document 1).

[Patent Document 1] Japanese Patent No. 3,614,828

However, the manufacturing method of the conventional semiconductor device 100 requires the process to align the heights of the plurality of internal connection terminals 102 and the process to expose the top surfaces 102A of the plurality of internal connection terminals 102 from the resin layer 103 by grinding the resin layer 103, so that there has been a problem that many process steps are required, thereby increasing the manufacturing cost.

SUMMARY OF THE INVENTION

The present invention is made in the light of the aforementioned problem, and its object is to provide a manufacturing method of a semiconductor device allowing reduction in the manufacturing cost.

According to a first aspect of the invention, there is provided with a manufacturing method of a semiconductor device including a semiconductor substrate on which a plurality of semiconductor chips are formed, the plurality of semiconductor chips having electrode pads, internal connection terminals provided on the electrode pads and wiring patterns connected to the internal connection terminals, the method including:

an insulating resin formation process for forming an insulating resin so as to cover the internal connection terminals and a surface of the plurality of semiconductor chips on which the internal connection terminals are provided;

a metal layer formation process for forming a metal layer on the insulating resin;

a pressure bonding process for pressure-bonding the metal layer and the internal connection terminals by pressing the metal layer; and a wiring pattern formation process for forming the wiring patterns by etching the metal layer after the pressure bonding process.

According to the invention, after the formation of the insulating resin so as to cover the plurality of internal connection terminals and the surface of the plurality of semiconductor chips on which the internal connection terminals are formed, by forming the metal layer, which is intended for the wiring pattern, on the insulating resin, and pressing this metal layer to pressure-bond the metal layer and the plurality of the internal connection terminals, the process to align the heights of the plurality of internal connection terminals, and the process to grind the insulating resin to expose the portions of the plurality of internal connection terminals from the insulating resin may be unnecessitated. In this way, the number of process steps may be reduced, allowing reduction in the manufacturing cost of the semiconductor device.

According to a second aspect of the invention, there is provided with a manufacturing method of a semiconductor device including a semiconductor substrate on which a plurality of semiconductor chips are formed, the plurality of semiconductor chips having electrode pads, internal connection terminals provided on the electrode pads and wiring patterns connected to the internal connection terminals, the method including:

an insulating resin formation process for forming an insulating resin so as to cover the internal connection terminals and a surface of the plurality of semiconductor chips on which the internal connection terminals are provided;

a metal layer lamination process for sequentially laminating a first metal layer and a second metal layer on the insulating resin;

a pressure bonding process for pressure-bonding the first metal layer and the internal connection terminals by pressing the second metal layer;

a connection pad formation process for forming connection pads by etching the second metal layer after the pressure bonding process; and a wiring pattern formation process for forming the wiring patterns by etching the first metal layer.

According to the invention, after the formation of the insulating resin so as to cover the plurality of internal connection terminals and the surface of the plurality of semiconductor chips on which the internal connection terminals are provided, by sequentially forming the first metal layer, which is intended for the wiring pattern, and the second metal layer, which is intended for the connection pads, over the insulating resin, and pressing the second metal layer to pressure-bond the first metal layer and the plurality of the internal connection terminals, the process to align the heights of the plurality of internal connection terminals, and the process to grind the insulating resin to expose the portions of the plurality of internal connection terminals from the insulating resin may be unnecessitated. In this way, the number of process steps may be reduced, allowing reduction in the manufacturing cost of the semiconductor device.

According to a third aspect of the invention, there is provided with a manufacturing method of a semiconductor device including a semiconductor substrate on which a plurality of semiconductor chips are formed, the plurality of semiconductor chips having electrode pads, internal connection terminals provided on the electrode pads and wiring patterns connected to the internal connection terminals, the method including:

an insulating resin formation process for forming an insulating resin so as to cover the internal connection terminals and a surface of the plurality of semiconductor chips on which the internal connection terminals are provided;

a layer lamination process for sequentially laminating a first metal layer, a second metal layer and a protective layer for protecting the second metal layer on the insulating resin;

a pressure bonding process for pressure-bonding the first metal layer and the internal connection terminals by pressing the protective layer after the layer lamination process;

a protective layer elimination process for eliminating the protective layer after the pressure bonding process;

a connection pad formation process for forming connection pads by etching the second metal layer; and a wiring pattern formation process for forming the wiring patterns by etching the first metal layer.

According to the invention, after the formation of the insulating resin so as to cover the plurality of internal connection terminals and the surface of the plurality of semiconductor chips on which the internal connection terminals are provided, by sequentially forming the first metal layer, which is intended for the wiring pattern, the second metal layer, which is intended for the connection pads, and the protective layer, which is intended for protecting the second metal layer, over the insulating resin, and pressing the protective layer to pressure-bond the first metal layer and the plurality of the internal connection terminals, the process to align the heights of the plurality of internal connection terminals, and the process to grind the insulating resin to expose the portions of the plurality of internal connection terminals from the insulating resin may be unnecessitated. In this way, the number of process steps may be reduced, allowing reduction in the manufacturing cost of the semiconductor device.

Furthermore, by pressing the protective layer formed on the second metal layer when pressure-bonding the first metal layer and the plurality of internal connection terminals, damages to the second metal layer may be prevented.

According to a forth aspect of the invention, there is provided with a manufacturing method of a semiconductor device including a semiconductor substrate on which a plurality of semiconductor chips are formed, the plurality of semiconductor chips having electrode pads, internal connection terminals provided on the electrode pads and wiring patterns connected to the internal connection terminals, the method including:

an insulating resin formation process for forming an insulating resin so as to cover the internal connection terminals and a surface of the plurality of semiconductor chips on which the internal connection terminals are provided;

a metal layer lamination process for sequentially laminating a first metal layer, a second metal layer and a third metal layer on the insulating resin;

a pressure bonding process for pressure-bonding the first metal layer and the internal connection terminals by pressing the third metal layer;

a metal post formation process for forming metal posts by etching the third metal layer after the pressure bonding process;

a connection pad formation process for forming connection pads by etching the second metal layer; and a wiring pattern formation process for forming the wiring patterns by etching the first metal layer.

According to the invention, after the formation of the insulating resin so as to cover the plurality of internal connection terminals and the surface of the plurality of semiconductor chips on which the internal connection terminals are formed, by sequentially forming the first metal layer, which is intended for the wiring pattern, the second metal layer, which is intended for the connection pads, and the third metal layer, which is intended for the metal posts, over the insulating resin, and pressing the third metal layer to pressure-bond the first metal layer and the plurality of the internal connection terminals, the process to align the heights of the plurality of internal connection terminals, and the process to grind the insulating resin to expose the portions of the plurality of internal connection terminals from the insulating resin may be unnecessitated. In this way, the number of process steps may be reduced, allowing reduction in the manufacturing cost of the semiconductor device.

Furthermore, by forming the metal posts over the connection pads, for example, by providing over the metal posts, the external connection terminals to be connected to a mounting board such as a mother board, any stresses (forces) that could be applied to the external connection terminals may be reduced.

According to a fifth aspect of the invention, there is provided with a manufacturing method of a semiconductor device including a semiconductor substrate on which a plurality of semiconductor chips are formed, the plurality of semiconductor chips having electrode pads, internal connection terminals provided on the electrode pads and wiring patterns connected to the internal connection terminals, the method including:

an anisotropic conductive resin formation process for forming an anisotropic conductive resin so as to cover the internal connection terminals and a surface of the plurality of semiconductor chips on which the internal connection terminals are provided;

a metal layer formation process for forming a metal layer on the anisotropic conductive resin;

a pressure bonding process for pressure-bonding the metal layer and the internal connection terminals by pressing the metal layer; and a wiring pattern formation process for forming the wiring patterns by etching the metal layer after the pressure bonding process.

According to the invention, after the formation of the anisotropic conductive resin so as to cover the plurality of internal connection terminals and the surface of the plurality of semiconductor chips on which the internal connection terminals are formed, by forming the metal layer, which is intended for the wiring patterns, over the anisotropic conductive resin, and pressing the metal layer to pressure-bond the metal layer and the plurality of the internal connection terminals, the process to align the heights of the plurality of internal connection terminals, and the process to grind the anisotropic conductive resin to expose the portions of the plurality of internal connection terminals from the anisotropic conductive resin may be unnecessitated. In this way, the number of process steps may be reduced, allowing reduction in the manufacturing cost of the semiconductor device.

Furthermore, by using the anisotropic conductive resin, the pressure to press the metal layer may be smaller compared to a case where an insulating resin is used, so that the semiconductor device may more easily be manufactured.

According to a sixth aspect of the invention, there is provided with a manufacturing method of a semiconductor device including a semiconductor substrate on which a plurality of semiconductor chips are formed, the plurality of semiconductor chips having electrode pads, internal connection terminals provided on the electrode pads and wiring patterns connected to the internal connection terminals, the method including:

an anisotropic conductive resin formation process for forming an anisotropic conductive resin so as to cover the internal connection terminals and a surface of the plurality of semiconductor chips on which the internal connection terminals are provided;

a metal layer lamination process for sequentially laminating a first metal layer and a second metal layer on the anisotropic conductive resin;

a pressure bonding process for pressure-bonding the first metal layer and the internal connection terminals by pressing the second metal layer;

a connection pad formation process for forming connection pads by etching the second metal layer after the pressure bonding process; and a wiring pattern formation process for forming the wiring patterns by etching the first metal layer.

According to the invention, after the formation of the anisotropic conductive resin so as to cover the plurality of internal connection terminals and the surface of the plurality of semiconductor chips on which the internal connection terminals are formed, by forming the first metal layer, which is intended for the wiring pattern, and the second metal layer, which is intended for the connection pads, over the anisotropic conductive resin, and pressing the second metal layer to pressure-bond the first metal layer and the plurality of the internal connection terminals, the process to align the heights of the plurality of internal connection terminals, and the process to grind the anisotropic conductive resin to expose the portions of the plurality of internal connection terminals from the anisotropic conductive resin may be unnecessitated. In this way, the number of process steps may be reduced, allowing reduction in the manufacturing cost of the semiconductor device.

According to a seventh aspect of the invention, there is provided with a manufacturing method of a semiconductor device including a semiconductor substrate on which a plurality of semiconductor chips are formed, the plurality of semiconductor chips having electrode pads, internal connection terminals provided on the electrode pads and wiring patterns connected to the internal connection terminals, the method including:

an anisotropic conductive resin formation process for forming an anisotropic conductive resin so as to cover the internal connection terminals and a surface of the plurality of semiconductor chips on which the internal connection terminals are provided;

a layer lamination process for sequentially laminating a first metal layer, a second metal layer and a protective layer for protecting the second metal layer on the anisotropic conductive resin;

a pressure bonding process for pressure-bonding the first metal layer and the internal connection terminals by pressing the protective layer after the layer lamination process;

a protective layer elimination process for eliminating the protective layer after the pressure bonding process;

a connection pad formation process for forming connection pads by etching the second metal layer; and a wiring pattern formation process for forming the wiring patterns by etching the first metal layer.

According to the invention, after the formation of the anisotropic conductive resin so as to cover the plurality of internal connection terminals and the surface of the plurality of semiconductor chips on which the internal connection terminals are formed, by forming the first metal layer, which is intended for the wiring pattern, the second metal layer, which is intended for the connection pads, and the protective layer, which is intended for protecting the second metal layer, over the anisotropic conductive resin, and pressing the protective layer to pressure-bond the first metal layer and the plurality of the internal connection terminals, the process to align the heights of the plurality of internal connection terminals, and the process to grind the anisotropic conductive resin to expose the portions of the plurality of internal connection terminals from the anisotropic conductive resin may be unnecessitated. In this way, the number of process steps may be reduced, allowing reduction in the manufacturing cost of the semiconductor device.

Furthermore, by pressing the protective layer formed on the second metal layer when pressure-bonding the first metal layer and the plurality of internal connection terminals, damages to the second metal layer may be prevented.

According to an eighth aspect of the invention, there is provided with a manufacturing method of a semiconductor device including a semiconductor substrate on which a plurality of semiconductor chips are formed, the plurality of semiconductor chips having electrode pads, internal connection terminals provided on the electrode pads and wiring patterns connected to the internal connection terminals, the method including:

an anisotropic conductive resin formation process for forming an anisotropic conductive resin so as to cover the internal connection terminals and a surface of the plurality of semiconductor chips on which the internal connection terminals are provided;

a metal layer lamination process for sequentially laminating a first metal layer, a second metal layer and a third metal layer over the anisotropic conductive resin;

a pressure bonding process for pressure-bonding the first metal layer and the internal connection terminals by pressing the third metal layer;

a metal post formation process for forming metal posts by etching the third metal layer after the pressure bonding process;

a connection pad formation process for forming connection pads by etching the second metal layer; and a wiring pattern formation process for forming the wiring patterns by etching the first metal layer.

According to the invention, after the formation of the anisotropic conductive resin so as to cover the plurality of internal connection terminals and the surface of the plurality of semiconductor chips on which the internal connection terminals are formed, by sequentially forming the first metal layer, which is intended for the wiring pattern, the second metal layer, which is intended for the connection pads, and the third metal layer, which is intended for the metal posts, over the anisotropic conductive resin, and pressing the third metal layer to pressure-bond the first metal layer and the plurality of internal connection terminals, the process to align the heights of the plurality of internal connection terminals, and the process to grind the anisotropic conductive resin to expose the portions of the plurality of internal connection terminals from the anisotropic conductive resin may be unnecessitated. In this way, the number of process steps may be reduced, allowing reduction in the manufacturing cost of the semiconductor device.

Furthermore, by forming the metal posts over the connection pads, for example, by providing over the metal posts, the external connection terminals to be connected to a mounting board such as a mother board, any stresses (forces) that could be applied to the external connection terminals may be reduced.

According to the invention, process steps may be reduced to minimize the manufacturing cost of a semiconductor device.

BRIEF DESCRIPTION OF THE DRAWINGS

FIG. 49 shows a manufacturing process step (No. 11) of the semiconductor device according to the fourth embodiment of the invention.

DETAILED DESCRIPTION OF THE PREFERRED EMBODIMENTS

Embodiments of the invention will now be explained with reference to figures.

Embodiment 1

Figure 1:
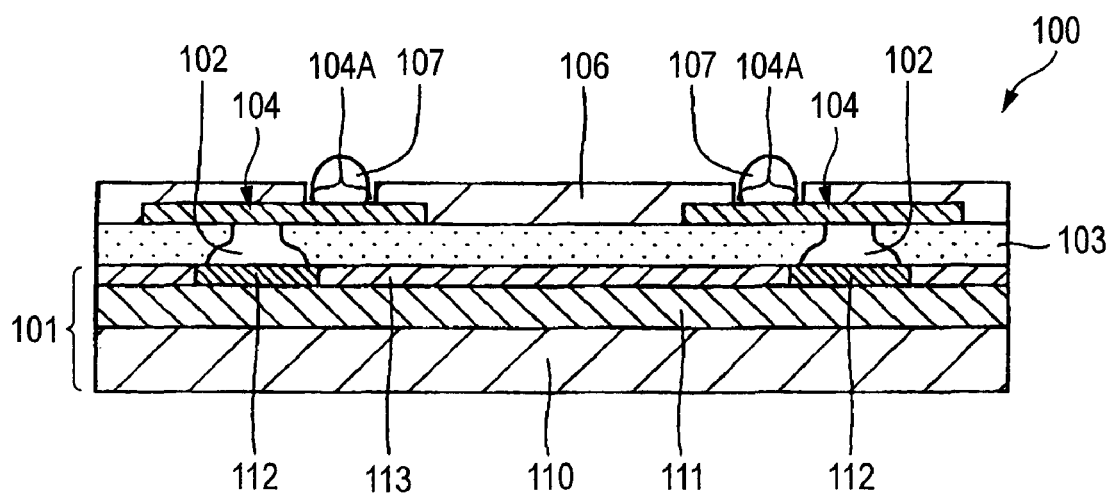
FIG. 1 is a cross-sectional view of a conventional semiconductor device.
Figure 2:
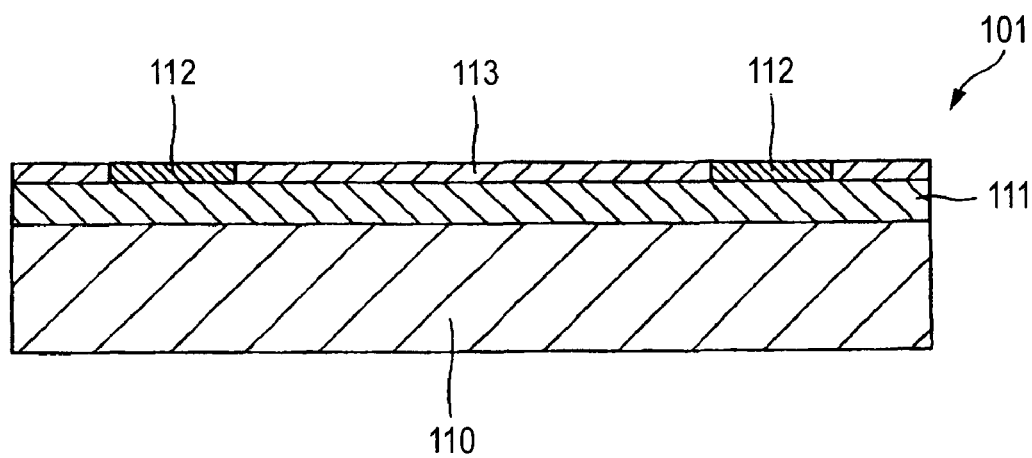
FIG. 2 shows a manufacturing process step (No. 1) of the conventional semiconductor device.
Figure 3:
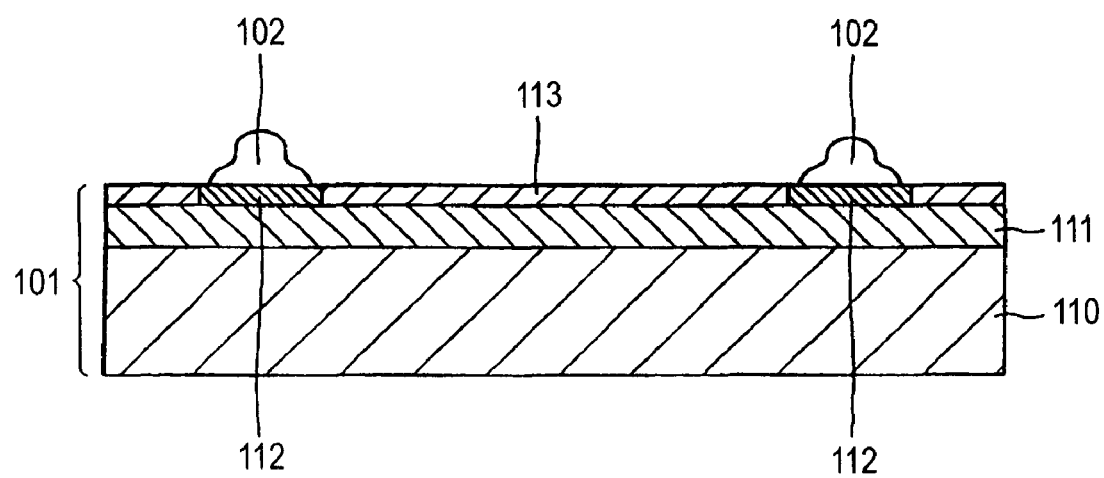
FIG. 3 shows a manufacturing process step (No. 2) of the conventional semiconductor device.
Figure 4:
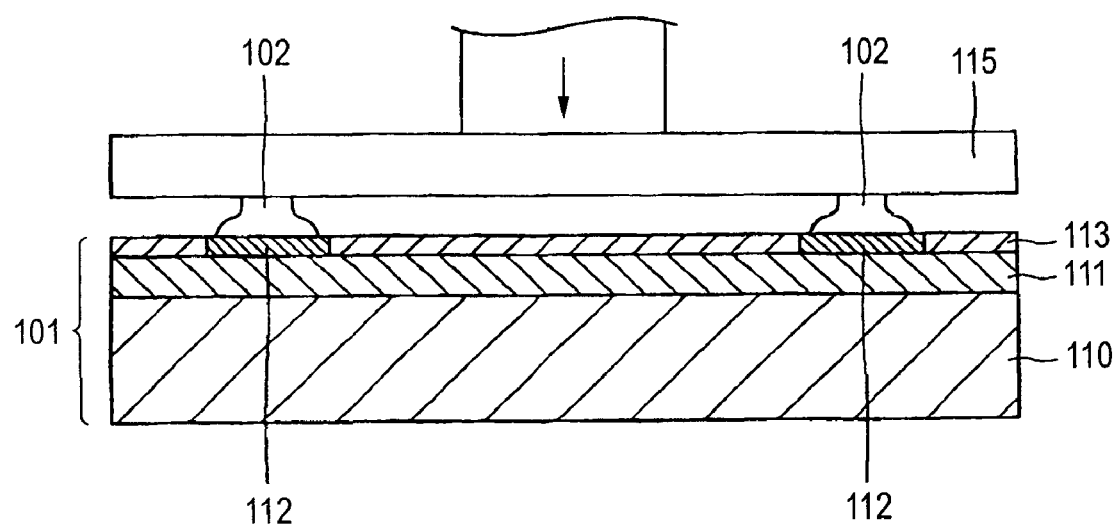
FIG. 4 shows a manufacturing process step (No. 3) of the conventional semiconductor device.
Figure 5:
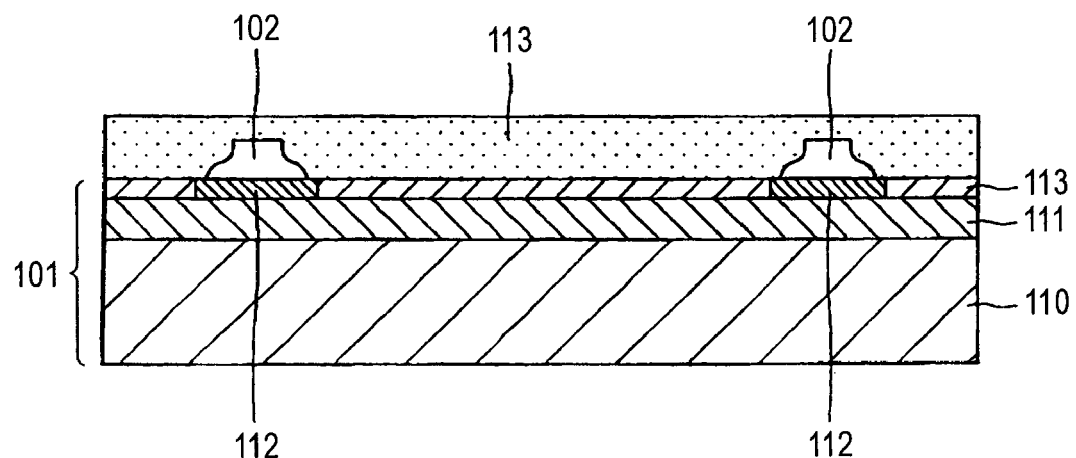
FIG. 5 shows a manufacturing process step (No. 4) of the conventional semiconductor device.
Figure 6:
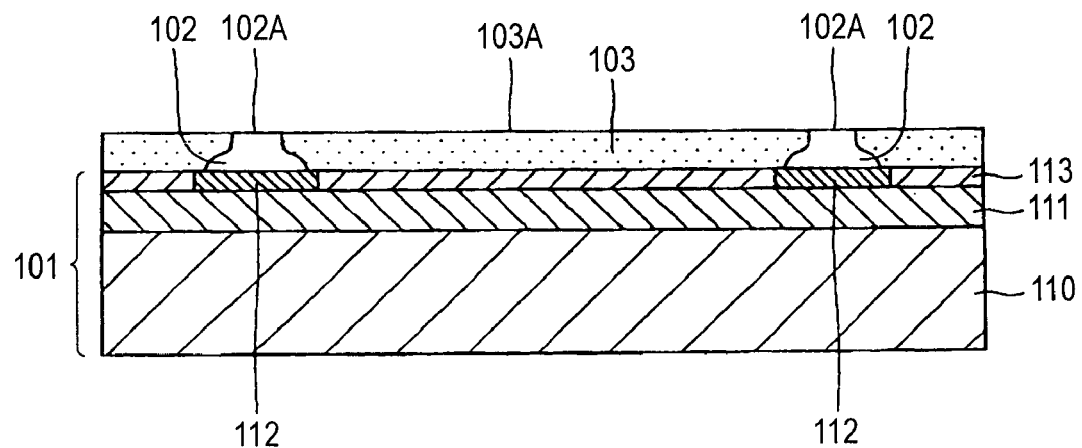
FIG. 6 shows a manufacturing process step (No. 5) of the conventional semiconductor device.
Figure 7:
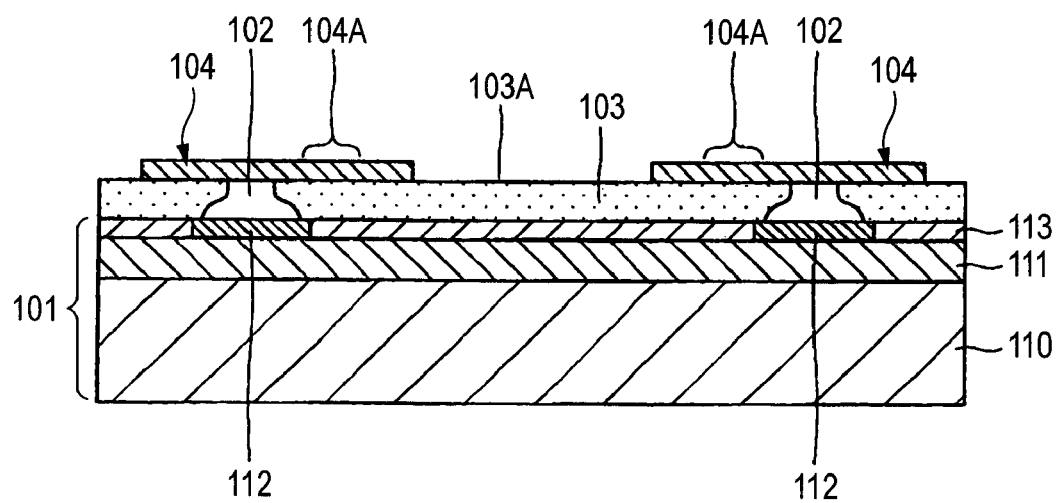
FIG. 7 shows a manufacturing process step (No. 6) of the conventional semiconductor device.
Figure 8:
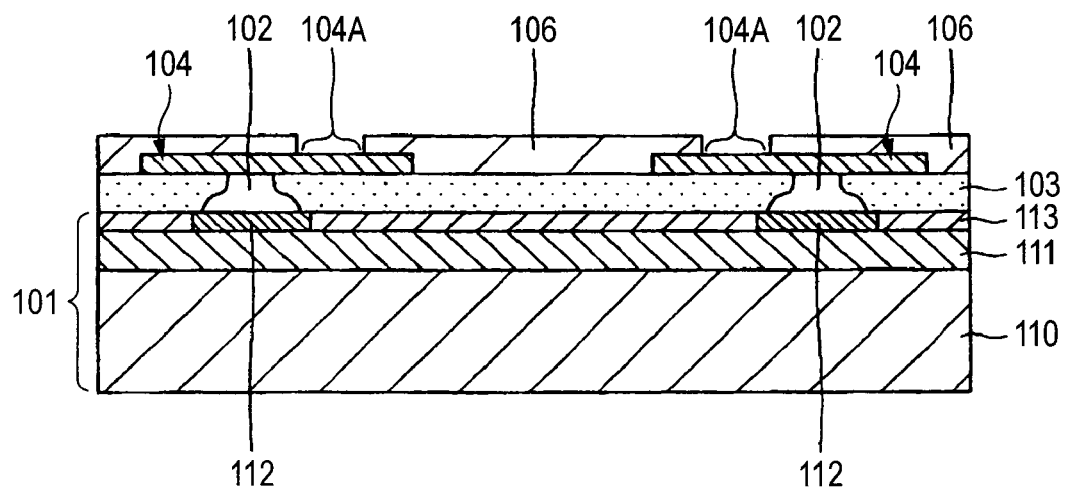
FIG. 8 shows a manufacturing process step (No. 7) of the conventional semiconductor device.
Figure 9:
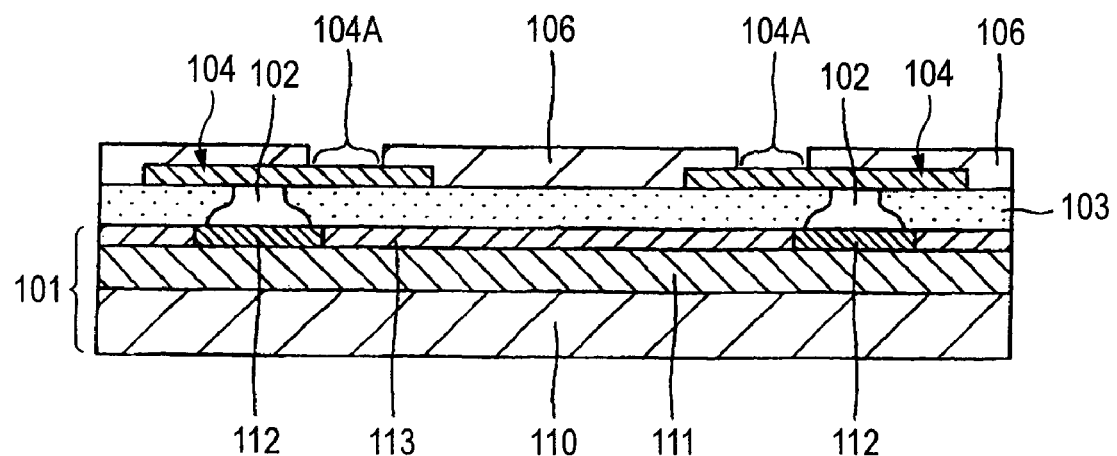
FIG. 9 shows a manufacturing process step (No. 8) of the conventional semiconductor device.
Figure 10:
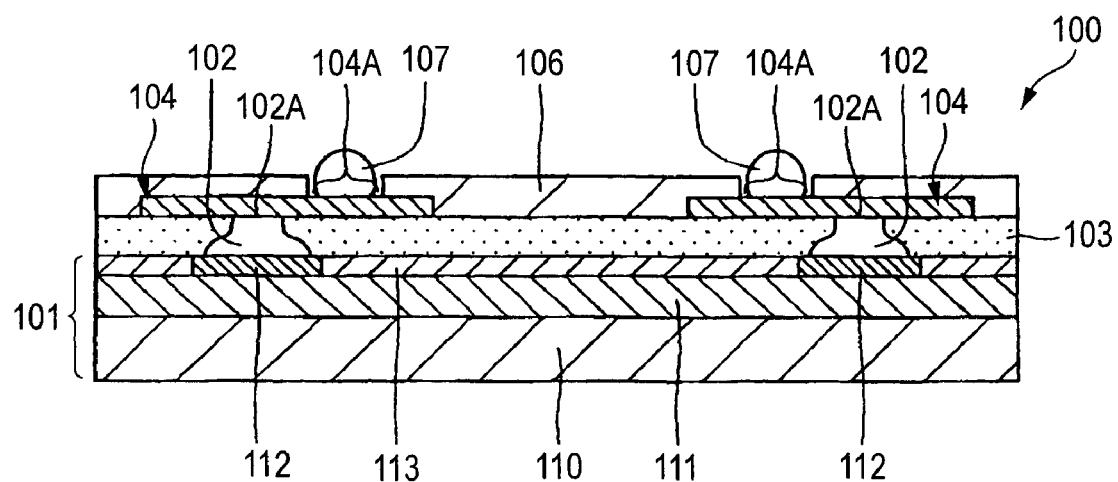
FIG. 10 shows a manufacturing process step (No. 9) of the conventional semiconductor device.
Figure 11:
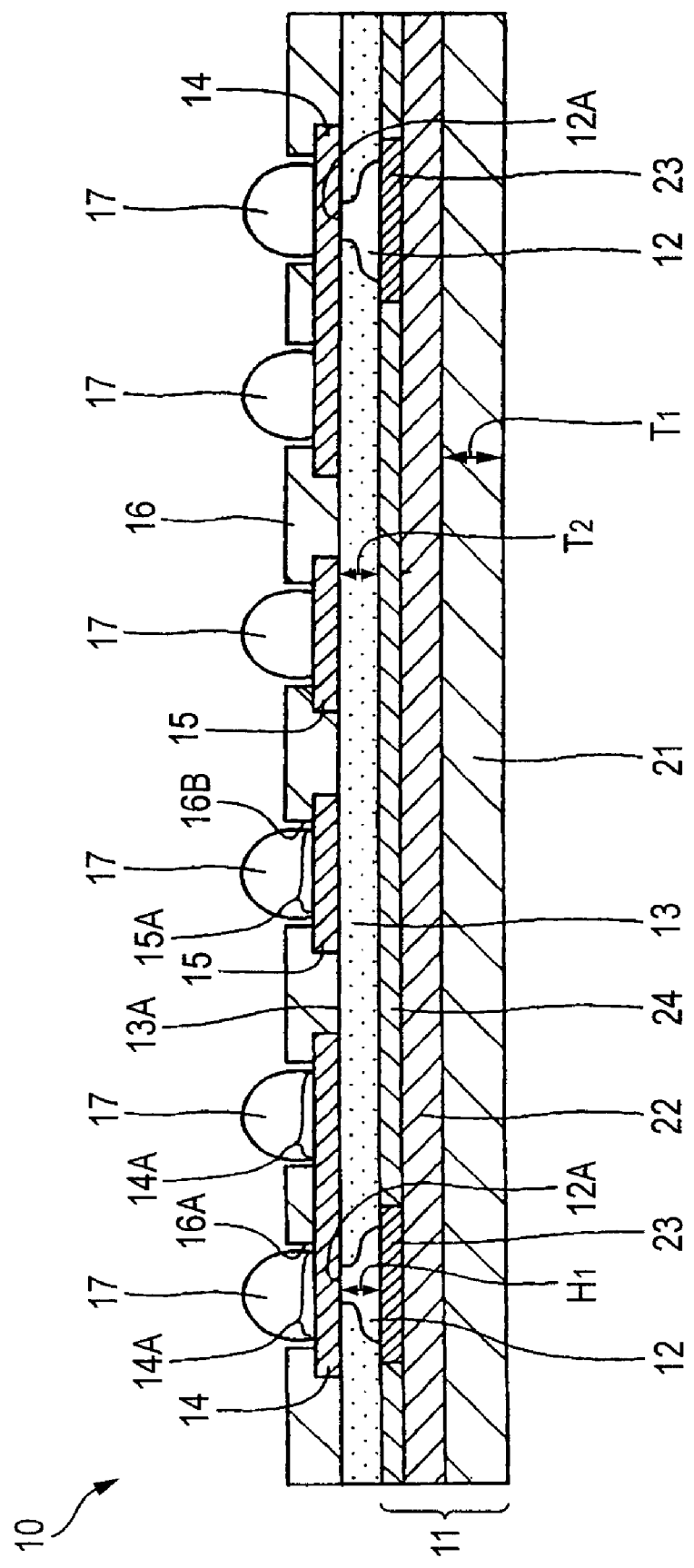
FIG. 11 is a cross-sectional view of a semiconductor device according to a first embodiment of the invention.

FIG. 11 is a cross-sectional view of a semiconductor device according to a first embodiment of the invention.

With reference to FIG. 11, a semiconductor device 10 according to the first embodiment of the invention includes a semiconductor chip 11, internal connection terminals 12, an insulating resin 13, wiring patterns 14, 15, a solder mask 16 and external connection terminals 17.

The semiconductor chip 11 includes a semiconductor substrate 21, a semiconductor integrated circuit 22, electrode pads 23 and a protective film 24. The semiconductor substrate 21 is a substrate for forming the semiconductor integrated circuit 22. The semiconductor substrate 21 has been thinned. The thickness $T_1$ of the semiconductor substrate 21 may for example be 100 μm to 300 μm. The semiconductor substrate 21 is, for example, one that has been singulated from a thinned Si wafer.

The semiconductor integrated circuit 22 is provided on the top surface of the semiconductor substrate 21. The semiconductor integrated circuit 22 includes, for example, a diffused layer(s) (not shown) formed in the semiconductor substrate 21, insulating layer(s) (not shown) laminated over the semiconductor substrate 21, via(s) (not shown) formed within the laminated insulating layer, and wiring(s) (not shown) and the like.

The electrode pads 23 are provided over the semiconductor integrated circuit 22 in a plural number. The electrode pads 23 are electrically connected to the wiring (not shown) provided on the semiconductor integrated circuit 22. As for a material of the electrode pads 23, Al may for example be used.

The protective film 24 is formed over the semiconductor integrated circuit 22. The protective film 24 is a film for protecting the semiconductor integrated circuit 22. As for the protective film 24, an SiN film, a PSG film or the like may be used.

The internal connection terminals 12 are formed on the electrode pads 23. The internal connection terminals 12 are ones provided for electrically connecting the semiconductor integrated circuit 22 and the wiring pattern 14. The height $H_1$ of the internal connection terminals 12 may for example be 10 μm to 60 μm. As for the internal connection terminals 12, for example, Au bumps, an Au plated film, or a metal film including an Ni film formed by nonelectrolytic plating and an Au film covering the Ni film may be used. The Au bumps may be formed through a bonding method or a plating method.

The insulating resin 13 is formed so as to cover portions of the internal connection terminals 12 other than the top surfaces 12A of the internal connection terminals 12, and the semiconductor chip 11. The top surfaces of the internal connection terminals 12 are exposed from the insulating resin 13. The top surface 13A of the insulating resin 13 is approximately flush with the top surfaces 12A of the internal connection terminals 12. As for the insulating resin, an adhesive sheet-type insulating resin (i.e. NCF (Non Conductive Film)) or a paste-type insulating resin (i.e. NCP (Non Conductive Paste)) may for example be used. The thickness $T_2$ of the insulating resin 13 may for example be 10 µm to 60 µm.

The wiring pattern 14 is provided over the top surface 13A of the insulating resin 13 so as to come into contact with the top surfaces 12A of the internal connection terminals 12. The wiring pattern 14 is in electrical connection with the semiconductor integrated circuit 22 via the internal connection terminals 12. The wiring pattern 14 has external connection terminal formation regions 14A on which the external connection terminals 17 are provided.

The wiring pattern 15 is provided over the top surface 13A of the insulating resin 13. The wiring pattern 15 has external connection terminal formation regions 15A on which the external connection terminals 17 are provided. As for the material of the wiring patterns 14, 15, Cu may be used, for example. The thickness of the wiring patterns 14, 15 may for example be 12 µm.

The solder mask 16 is provided over the insulating resin 13 so as to cover the portions of the wiring patterns 14, 15 except for the external connection terminal formation regions 14A, 15A. The solder mask 16 has openings 16A for exposing the external connection terminal formation regions 14A and openings 16B for exposing the external connection terminal formation regions 15A.

The external connection terminals 17 are provided on the external connection terminal formation regions 14A, 15A of the wiring patterns 14, 15. The external connection terminals 17 are the terminals which will come into electrical contact with pads provided on a mounting board (not shown) such as a mother board or the like. As for the external connection terminals 17, solder bumps may for example be used.

Figure 21:
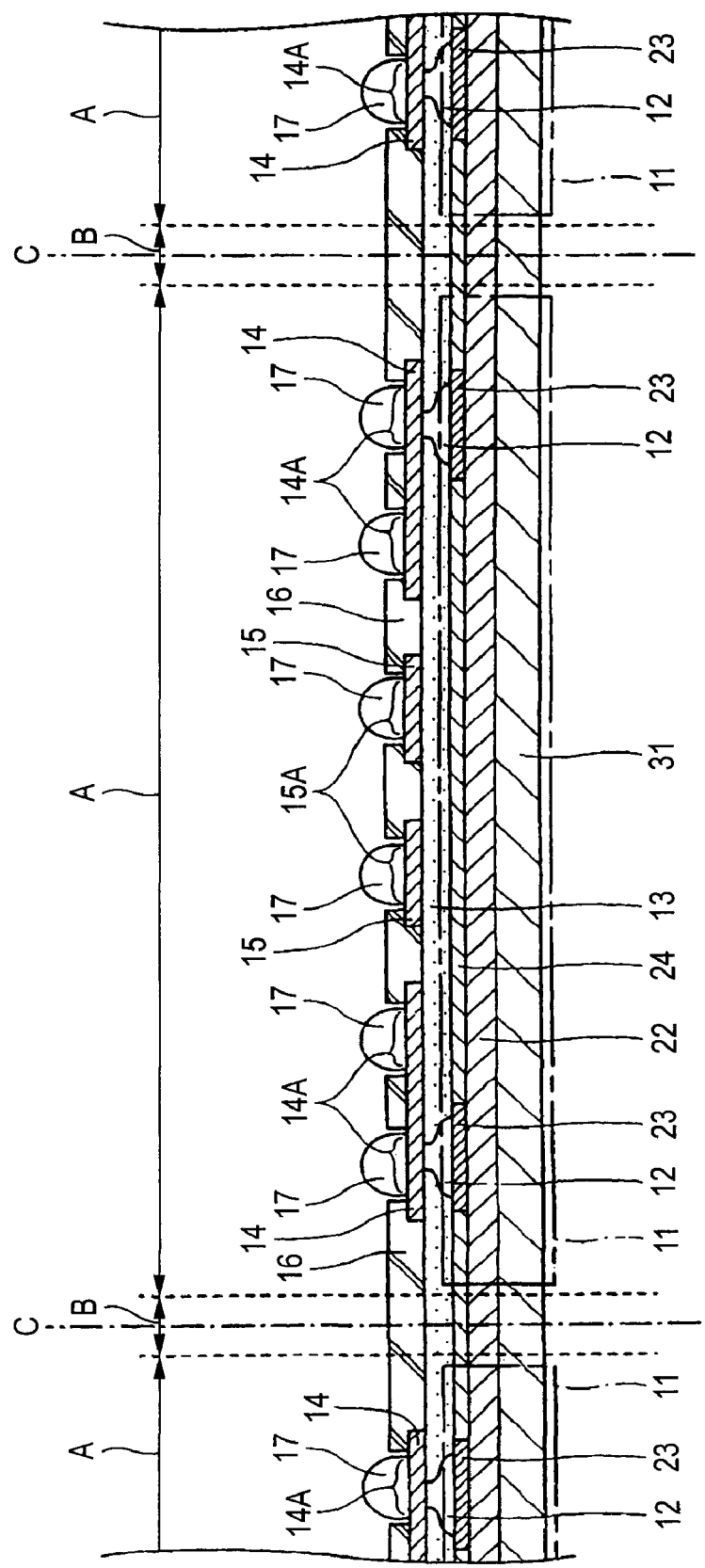
FIG. 21 shows a manufacturing process step (No. 10) of the semiconductor device according to the first embodiment of the invention.
Figure 22:
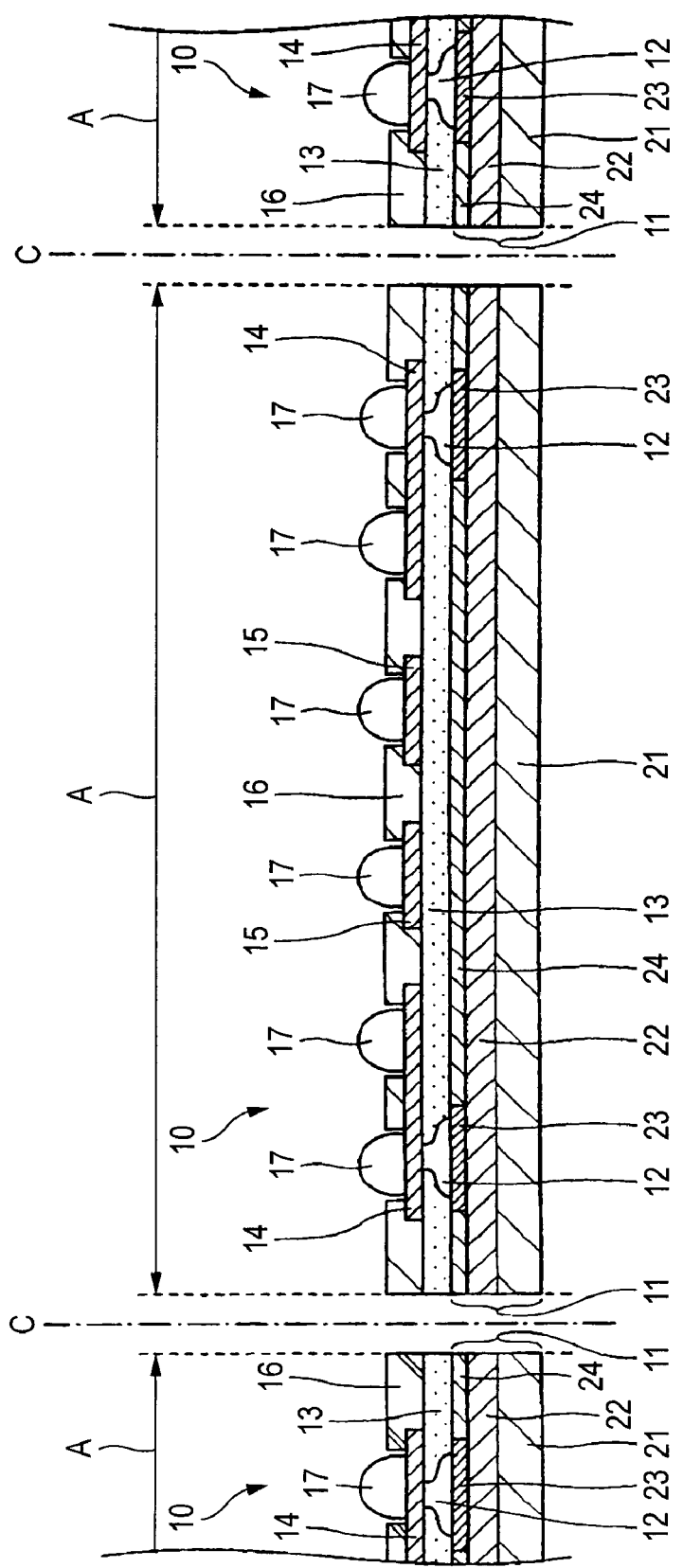
FIG. 22 shows a manufacturing process step (No. 11) of the semiconductor device according to the first embodiment of the invention.
Figure 23:
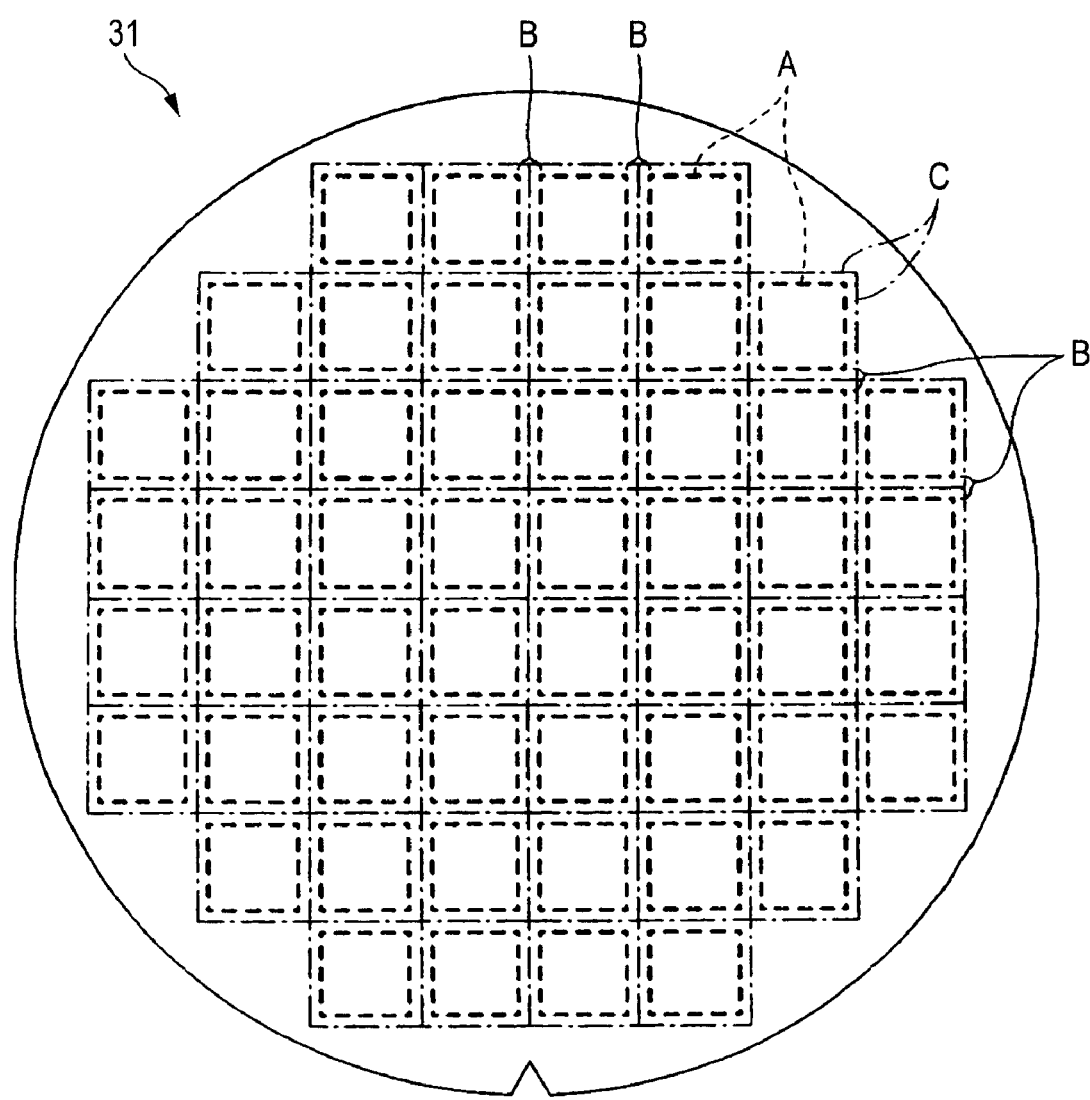
FIG. 23 is a plan view of a semiconductor substrate.

FIGS. 12 through 22 are views showing manufacturing steps of the semiconductor device according to the first embodiment of the invention, and FIG. 23 is a plan view of the semiconductor substrate. In FIGS. 12 through 23, any constituents identical to those in the semiconductor device 10 of the first embodiment are denoted by identical reference numerals. In addition, within FIGS. 12 through 23, "C" indicates positions in the semiconductor substrate 31 to be cut by a dicer (hereinafter it is referred to as "Cutting Positions C").

Figure 12:
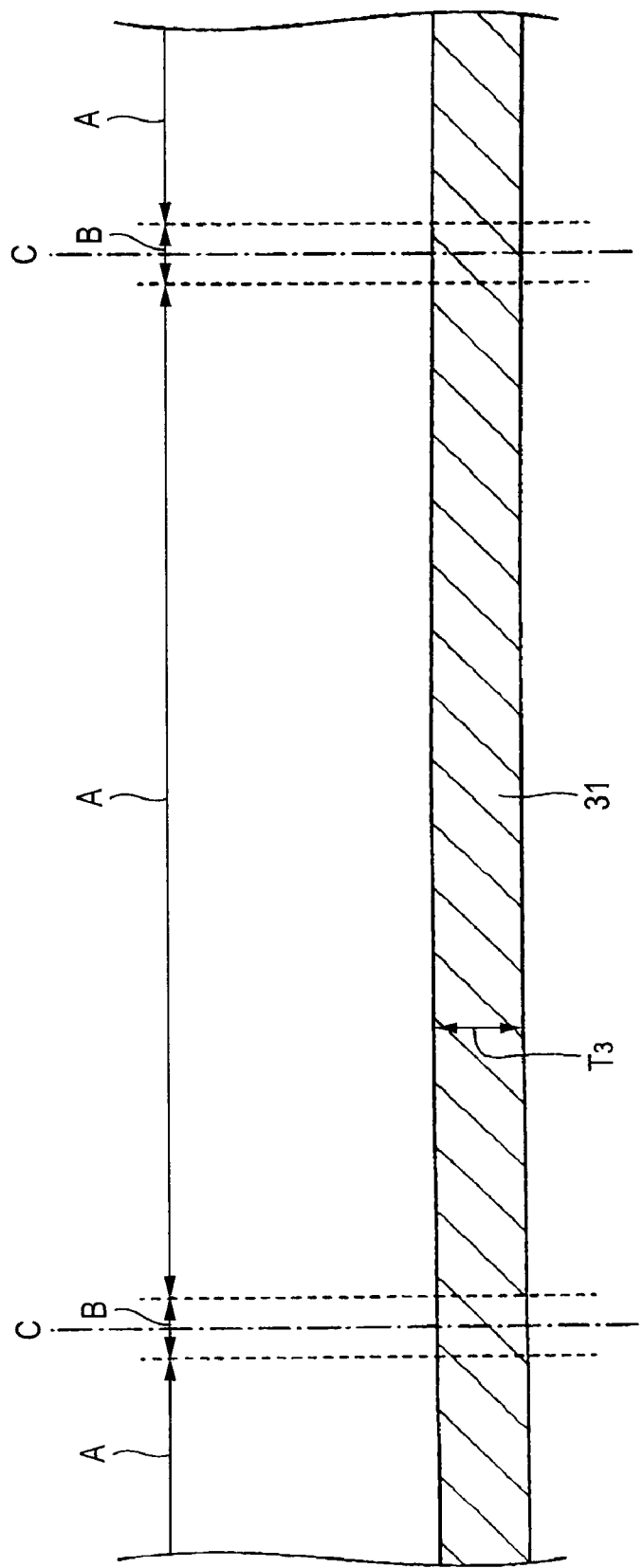
FIG. 12 shows a manufacturing process step (No. 1) of the semiconductor device according to the first embodiment of the invention.

First, in a process step shown in FIG. 12, a semiconductor substrate 31, having a plurality of semiconductor device formation regions A and scribing regions B for separating the plurality of semiconductor device formation regions A, is provided (see FIG. 23). The semiconductor device formation regions A are regions in which the semiconductor devices 10 are formed. The semiconductor substrate 31 is thinned and cut at the cutting positions C to constitute the semiconductor substrate 21 (see FIG. 11) previously explained. As for the semiconductor substrate 31, an Si wafer may for example be used. The thickness $T_3$ of the semiconductor substrate 31 is 500 µm to 775 µm, for example.

Figure 13:
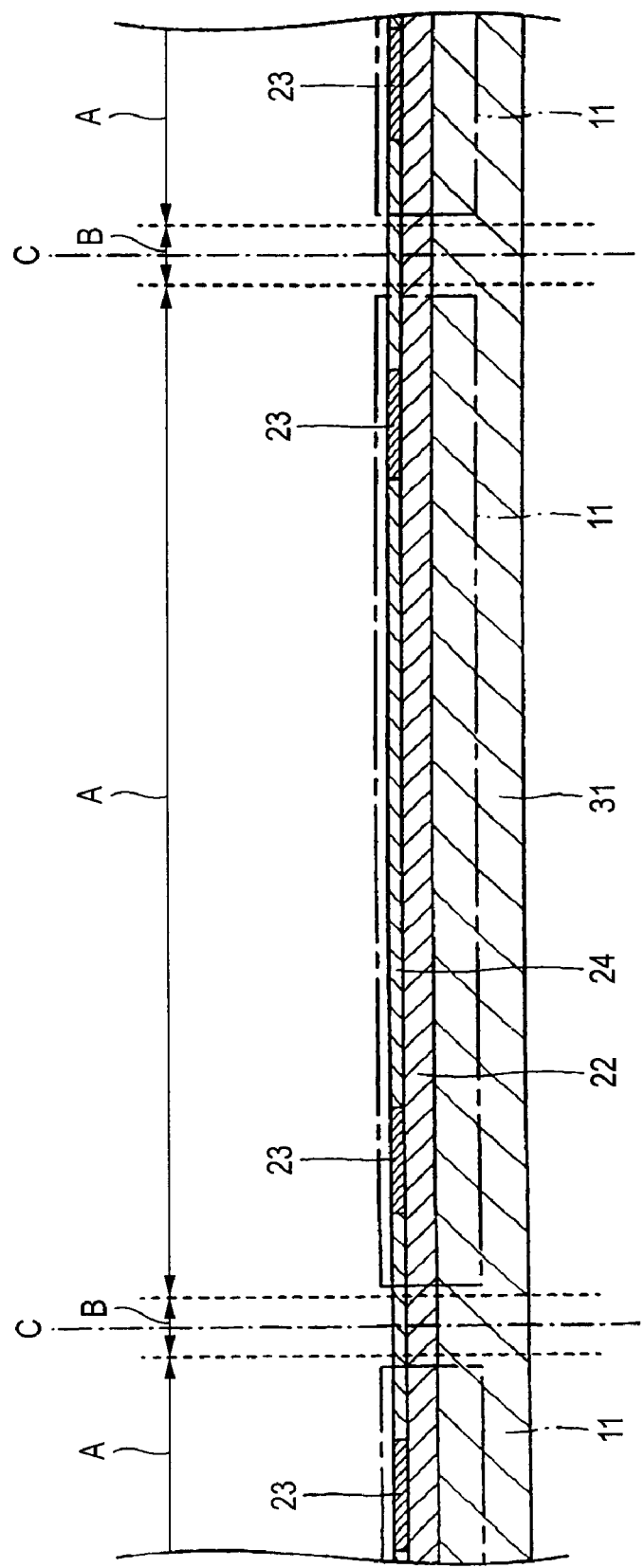
FIG. 13 shows a manufacturing process step (No. 2) of the semiconductor device according to the first embodiment of the invention.

Next, in a process step shown in FIG. 13, over the top surface of the semiconductor substrate 31 which corresponds to the semiconductor device formation regions A, the semiconductor chips 11 including the semiconductor integrated circuit 22, electrode pads 23, and the protective film 24 are formed. As for the material of the electrode pads 23, Al may for example be used. As for the protective film 24, an SiN film, a PSG film or the like may be used.

Figure 14:
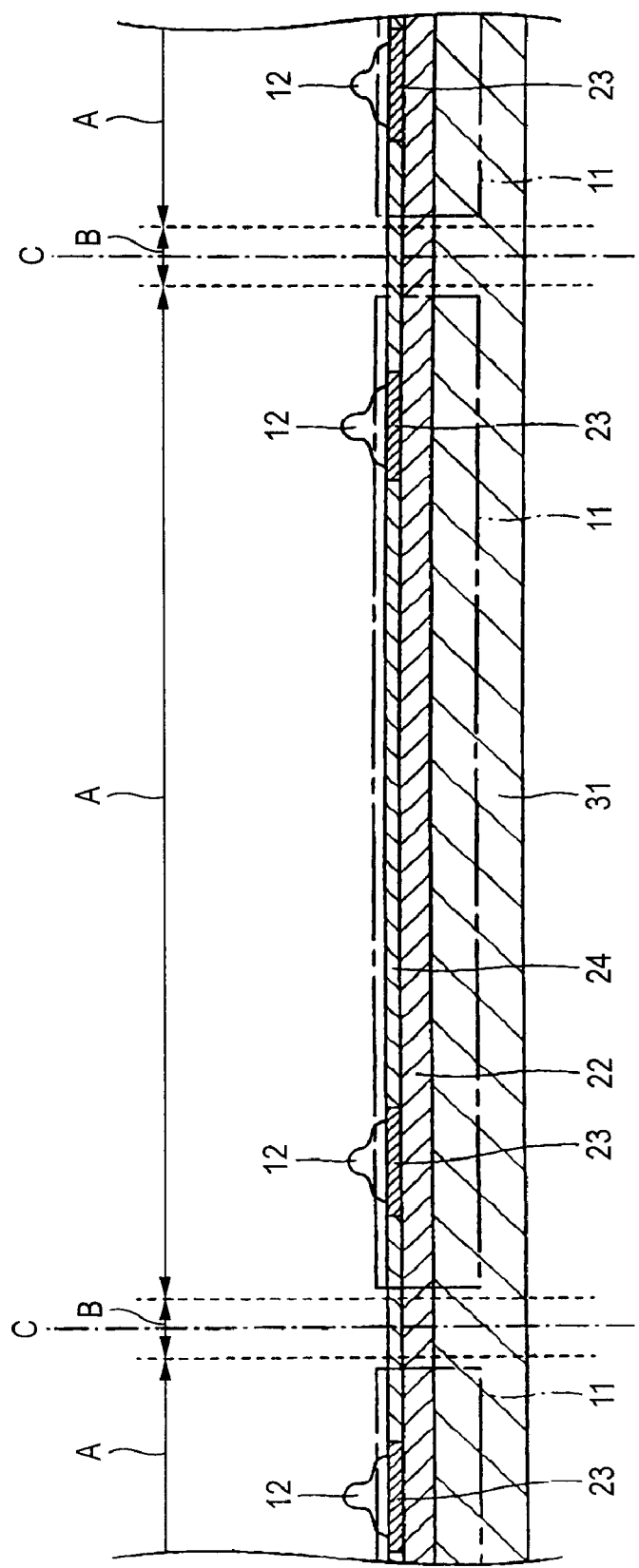
FIG. 14 shows a manufacturing process step (No. 3) of the semiconductor device according to the first embodiment of the invention.

In a process step shown in FIG. 14, over the plurality of electrode pads 23 provided within the plurality of semiconductor device formation regions A, the internal connection terminals are respectively formed. As for the internal connection terminals 12, for example, Au bumps, an Au plated film, or a metal film including an Ni film formed by nonelectrolytic plating and an Au film covering the Ni film may be used. The Au bumps may be formed through a bonding method, for example. The plurality of internal connection terminals 12 formed by the process step shown in FIG. 14 vary in their heights.

Figure 15:
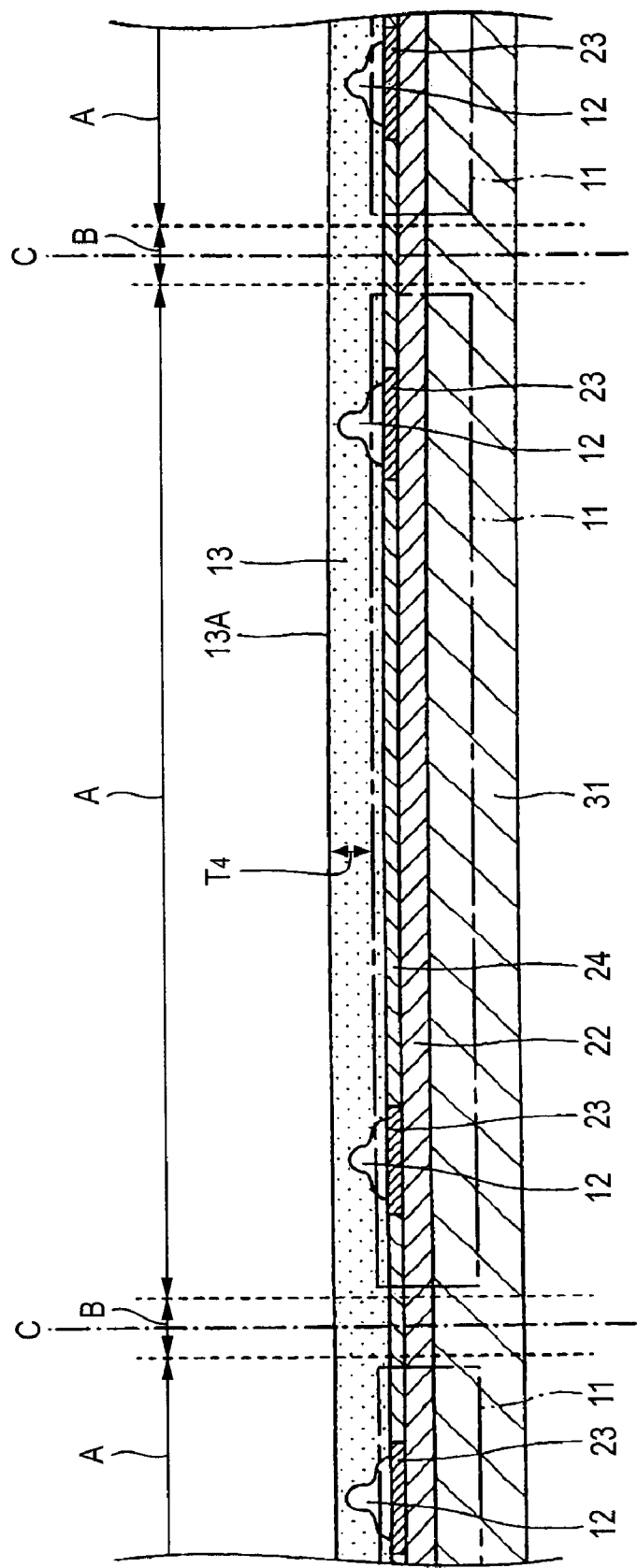
FIG. 15 shows a manufacturing process step (No. 4) of the semiconductor device according to the first embodiment of the invention.

Thereafter, in a process step shown in FIG. 15, the insulating resin 13 is formed (insulating resin formation process) over the internal connection terminals 12 and a surface of the plurality of the semiconductor chips 11 on which the internal connection terminals 12 are provided (top surfaces of the plurality of semiconductor chips 11). As for the insulating resin 13, an adhesive sheet-type insulating resin (i.e. NCF (Non Conductive Film)) or a paste-type insulating resin (i.e. NCP (Non Conductive Paste)) may for example be used. When the adhesive sheet-type insulating resin is used, the insulating resin 13 is formed by attaching the sheet-type insulating resin onto the top surface of the structure shown in FIG. 14. When the paste type insulating resin is used as the insulating resin 13, the paste-type insulating resin is formed over the top surface of the structure shown in FIG. 14 by a printing method, and then prebaking the insulating resin to a semi-cured state. This semi-cured insulating resin is adherent. The thickness $T_4$ of the insulating resin 13 may for example be 20 µm to 100 µm.

Figure 16:
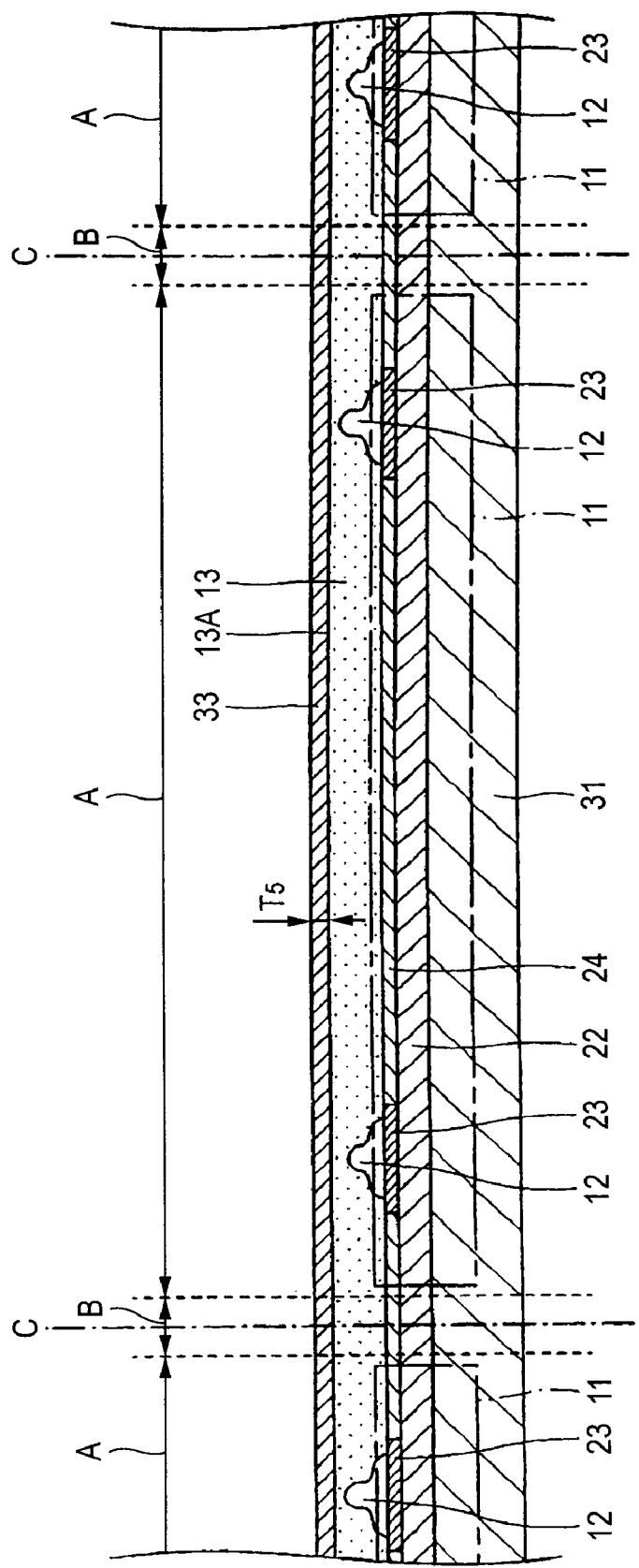
FIG. 16 shows a manufacturing process step (No. 5) of the semiconductor device according to the first embodiment of the invention.

Next, in a process step shown in FIG. 16, a metal layer 33 is formed on the top surface 13A of the insulating resin 13 (metal layer formation process). The metal layer 33 is one which is going to be etched during a process step later-described with reference to FIG. 18 to constitute the wiring patterns 14, 15. More specifically, a Cu foil is provided as the metal layer 33, and this Cu foil is adhered onto the top surface 13A of the insulating resin 13. The thickness $T_5$ of the metal layer 33 may for example be 10 µm.

Figure 17:
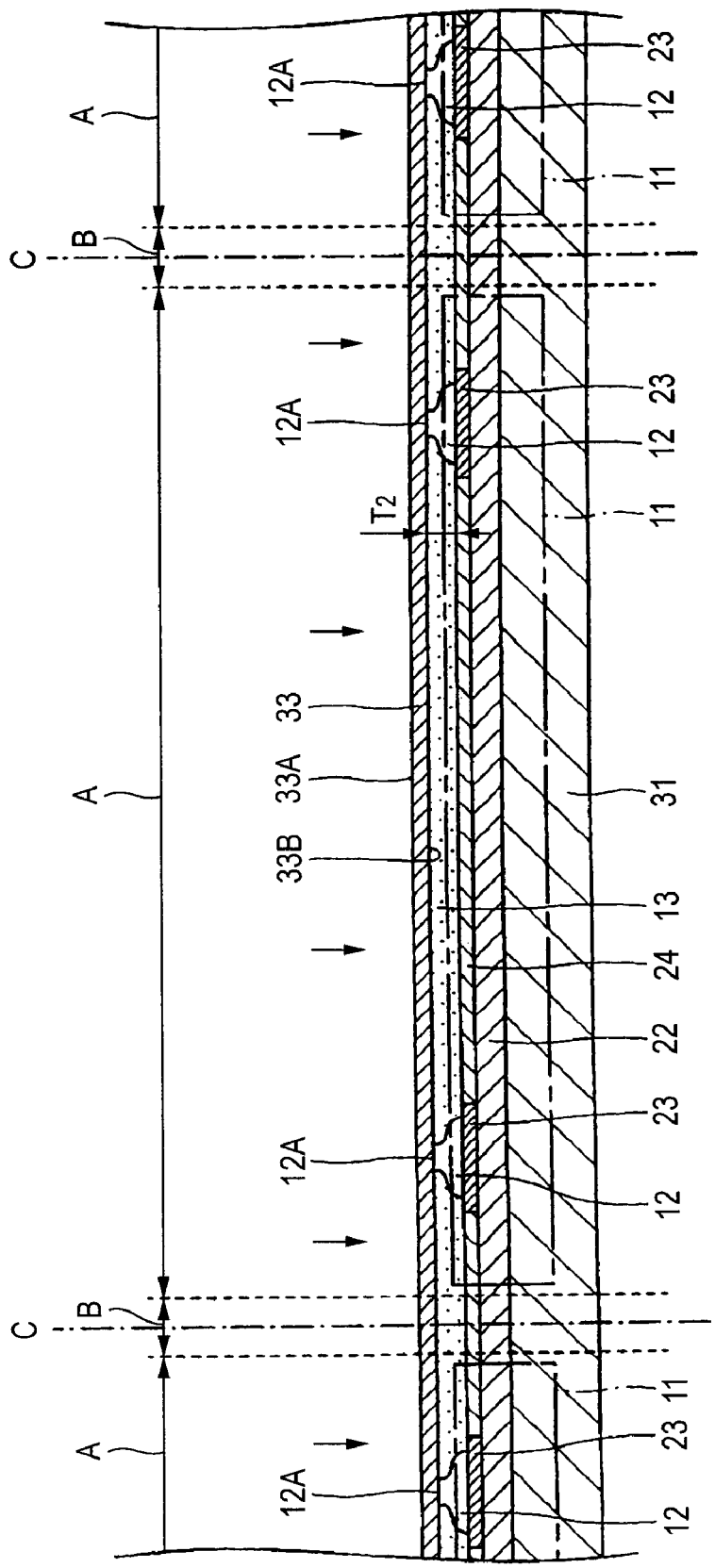
FIG. 17 shows a manufacturing process step (No. 6) of the semiconductor device according to the first embodiment of the invention.

Next, in a process step shown in FIG. 17, while heating the structure shown in FIG. 17, the metal layer 33 is pressed from the top surface 33A of the metal layer 33, to have the bottom surface 33B of the metal layer and the top surfaces 12A of the plurality of internal connection terminals 12 come into contact, and to have the metal layer 33 and the internal connection terminals 12 pressure-bonded (pressure bonding process). Also, by heating the structure shown in FIG. 17, the insulating resin 13 will cure. The thickness $T_2$ of the insulating resin 13 after the pressure bonding may for example be 10 µm to 60 µm.

In this way, by forming the metal layer 33 intended for the wiring patterns 14, 15 over the insulating resin 13, and pressing the metal layer 33 to pressure-bond the metal layer 33 and the plurality of internal connection terminals 12, the process to align the heights of the plurality of internal connection terminals 12, and the process to grind the insulating resin 13 to expose the top portions of the plurality of internal connection terminals from the insulating resin, which have conventionally been practiced, may be unnecessitated. In this way, the number of process steps required for manufacturing the semiconductor devices 10 may be reduced, allowing reduction in the manufacturing cost of the semiconductor device 10.

Figure 18:
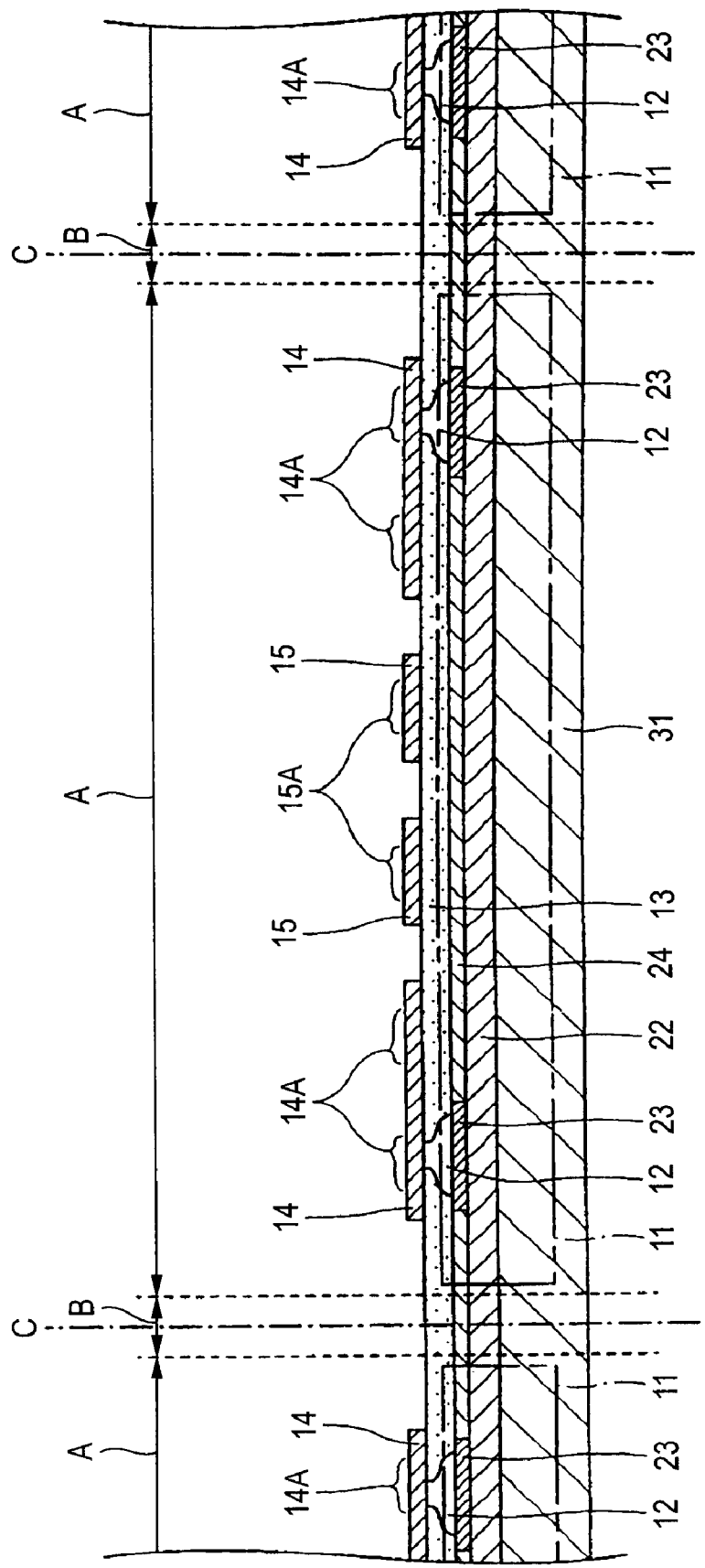
FIG. 18 shows a manufacturing process step (No. 7) of the semiconductor device according to the first embodiment of the invention.

Next, in a process step shown in FIG. 18, the metal layer 33 is patterned by etching to form the wiring patterns 14, 15 within the plurality of semiconductor device formation regions A (wiring pattern formation process), and thereafter, a roughening treatment of the wiring patterns 14, 15 is performed.

More specifically, after a patterned resist film is formed over the metal layer 33, the metal layer 33 is etched to form the wiring patterns 14, 15 by using the resist film as a mask. The roughening treatment of the wiring patterns 14, 15 may be performed through a black oxide process or a roughening etch process. The roughening treatment is performed in order to improve the adhesion of the wiring patterns 14, 15 with the solder mask 16 to be formed on the top and side surfaces of the wiring patterns 14, 15.

Figure 19:
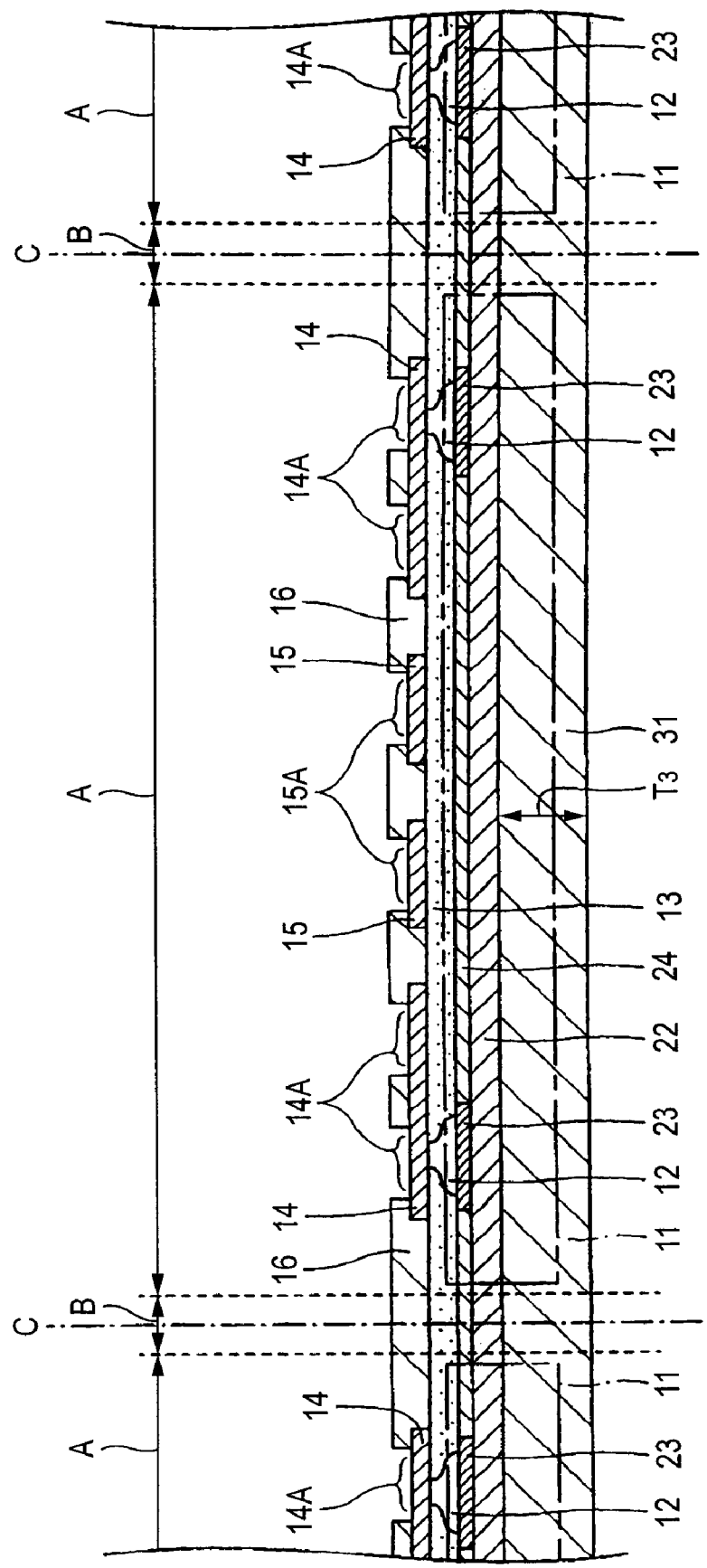
FIG. 19 shows a manufacturing process step (No. 8) of the semiconductor device according to the first embodiment of the invention.

Next, in a process step shown in FIG. 19, the solder mask 16 is formed so as to cover the insulating resin 13 and the portion of the wiring patterns 14, 15 except for the external connection terminal formation regions 14A, 15A.

Figure 20:
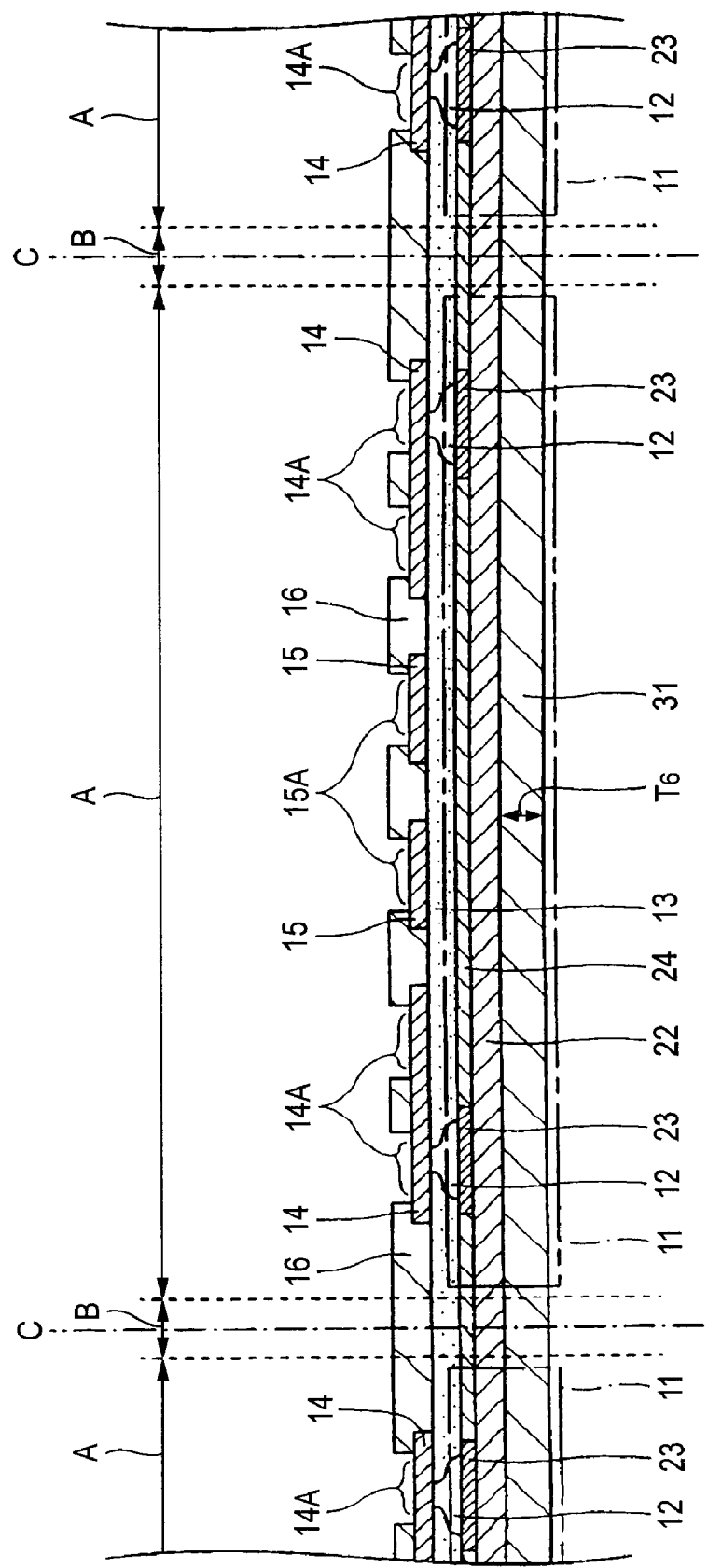
FIG. 20 shows a manufacturing process step (No. 9) of the semiconductor device according to the first embodiment of the invention.

Next, in a process step shown in FIG. 20, the semiconductor substrate 31 is lapped or ground from the back surface of the semiconductor substrate 31 to thin down the semiconductor substrate 31. In thinning the semiconductor substrate 31, a back-side grinder may for example be used. The thickness $T_6$ of the semiconductor substrate 31 after thinning may for example be 100 μm to 300 μm.

Next, in a process step shown in FIG. 21, the external connection terminals 17 are formed on the external connection terminal formation regions 14A, 15A of the wiring patterns 14, 15. In this way, structures equivalent to the semiconductor device 10 are formed within the plurality of the semiconductor device formation regions A.

Next, in a process step shown in FIG. 22, the semiconductor substrate 31 is cut along the cutting positions C. In this way, a plurality of semiconductor devices 10 are completed.

According to the manufacturing method of the present embodiment, after the formation of the insulating resin 13 so as to cover the plurality of internal connection terminals 12 and a surface of the plurality of semiconductor chips 11 (top surface of the plurality of semiconductor chips 11) on which the internal connection terminals 12 are formed, by forming the metal layer 33, which is intended for the wiring patterns 14, 15, on the insulating resin 13, and by pressing this metal layer to pressure-bond the metal layer 33 and the plurality of the internal connection terminals 12, the process to align the heights of the plurality of internal connection terminals 12, and the process to grind the insulating resin 13 to expose the top portions of the plurality of internal connection terminals 12 from the insulating resin may be unnecessitated, so that the number of process steps may be reduced, allowing reduction in the manufacturing cost of the semiconductor device 10.

Embodiment 2

Figure 24:
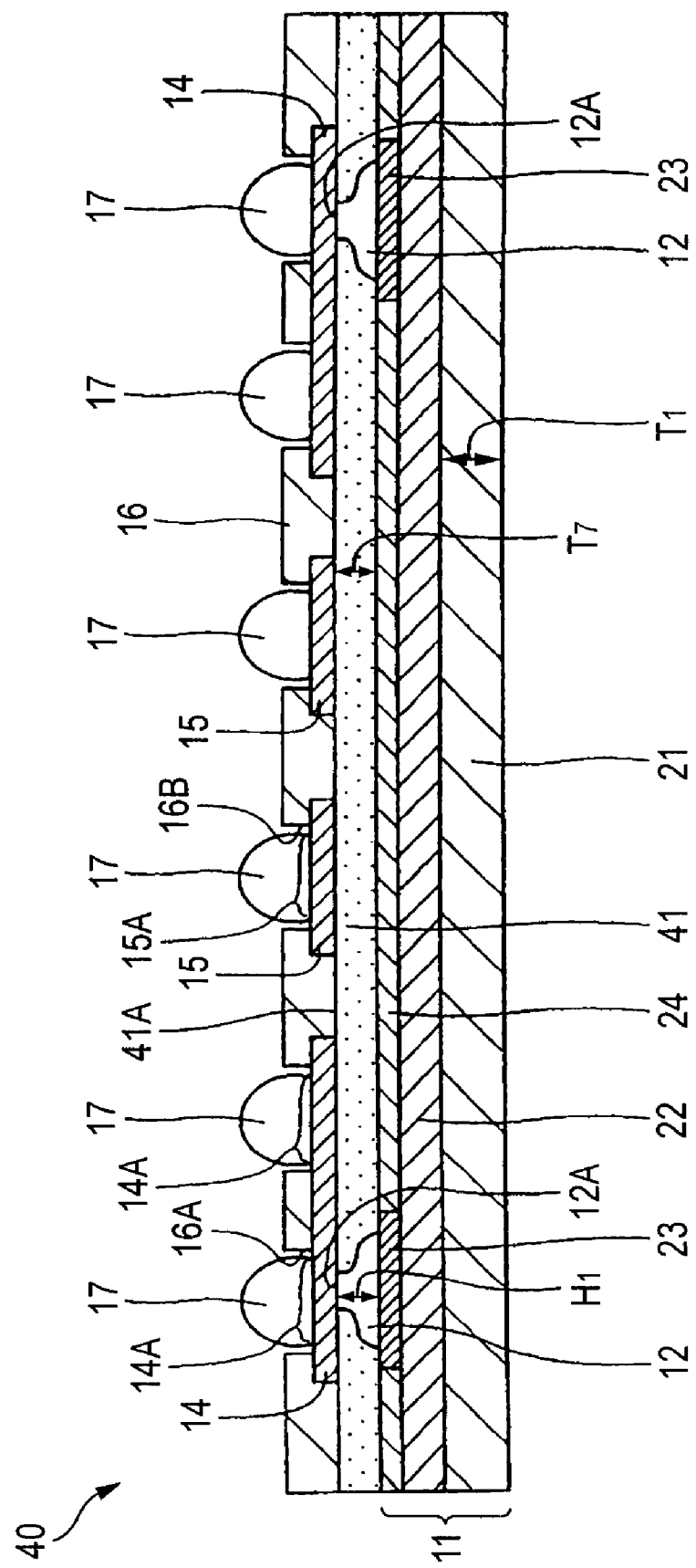
FIG. 24 is a cross-sectional view of a semiconductor device according to a second embodiment of the invention.

FIG. 24 is a cross-sectional view showing a semiconductor device according to a second embodiment of the invention.

With reference to FIG. 24, a semiconductor device 40 of the second embodiment is configured in a similar manner as the semiconductor device 10 of the first embodiment, except that it has an anisotropic conductive resin 41 instead of the insulating resin 13 used on the semiconductor device 10.

As for the anisotropic conductive resin 41, an adhesive sheet-type anisotropic conductive resin (i.e. ACF (Anisotropic Conductive Film)) or a paste-type anisotropic conductive resin (i.e. ACP (Anisotropic Conductive Paste)) etc. may be used. ACP and ACF are epoxy resin-based insulating resins containing small resin spheres covered by Ni/Au dispersed therein, and they are the resins which have conductivity in the vertical direction, and insulation property in the horizontal direction. The thickness $T_7$ of the anisotropic conductive resin 41 may for example be 10 μm to 60 μm.

Figure 25:
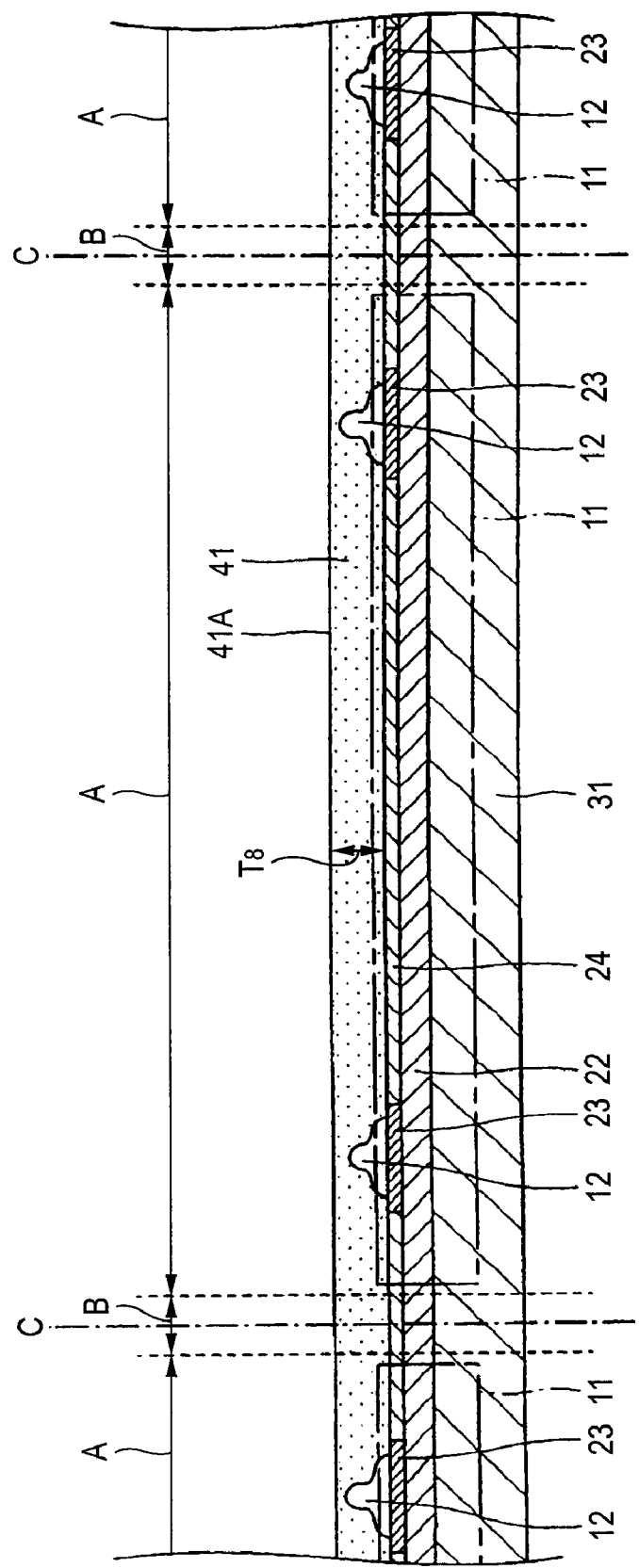
FIG. 25 shows a manufacturing process step (No. 1) of the semiconductor device according to the second embodiment of the invention.
Figure 26:
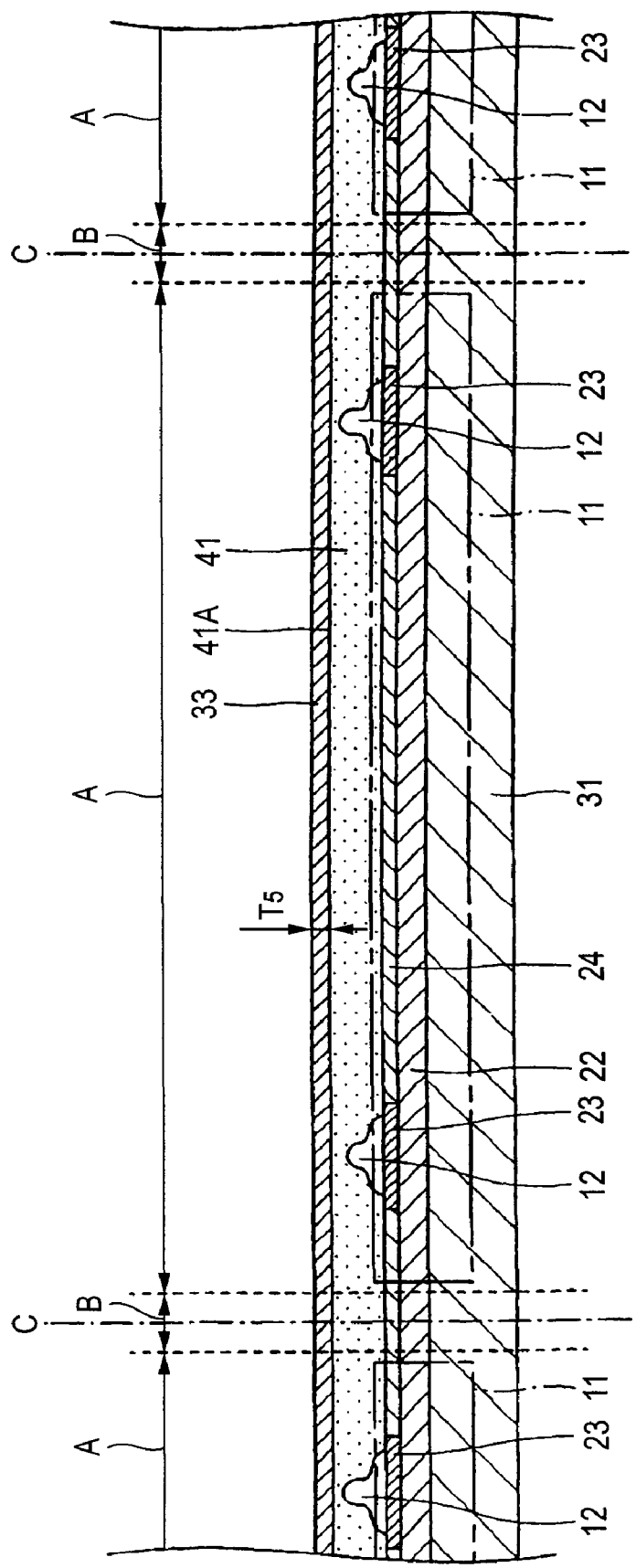
FIG. 26 shows a manufacturing process step (No. 2) of the semiconductor device according to the second embodiment of the invention.
Figure 27:
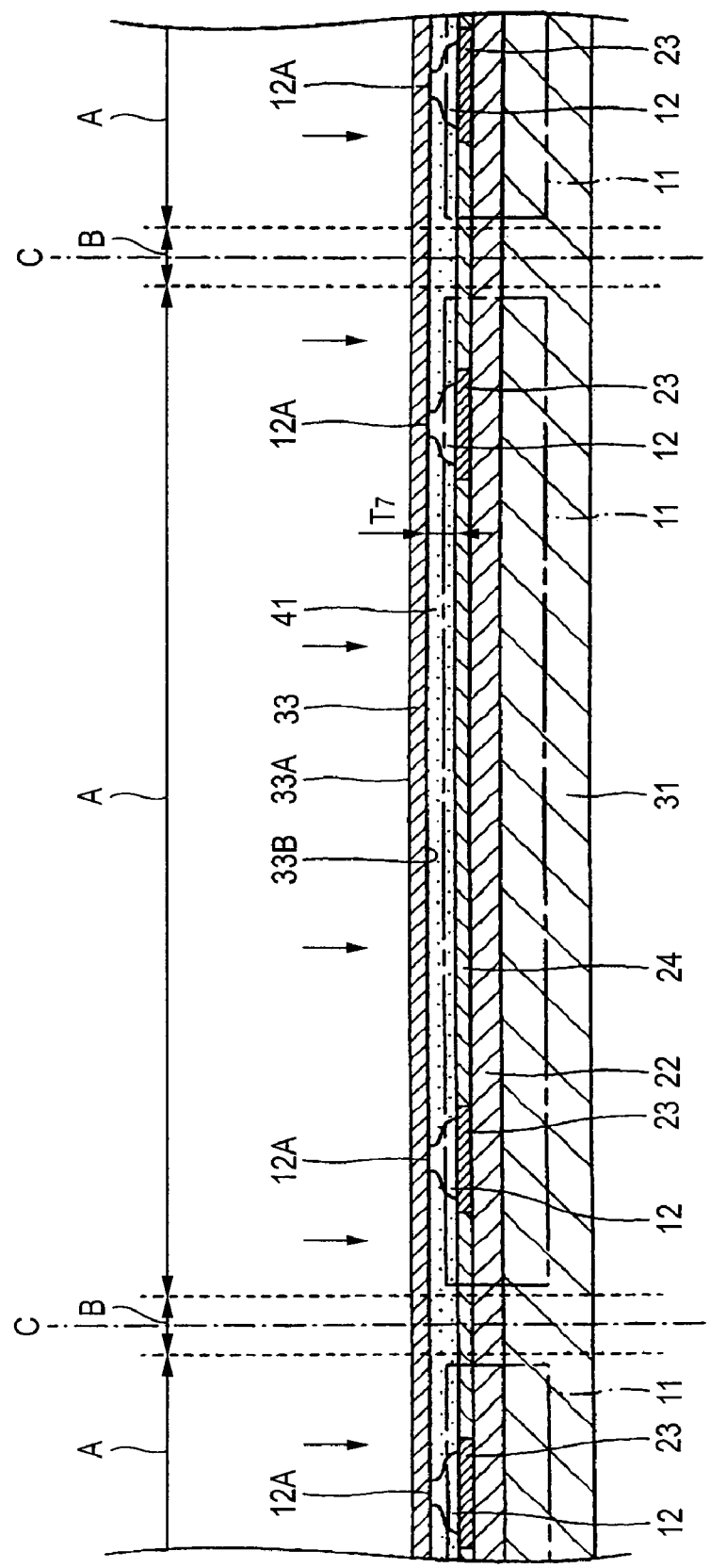
FIG. 27 shows a manufacturing process step (No. 3) of the semiconductor device according to the second embodiment of the invention.

FIGS. 25 through 27 are views showing manufacturing steps of the semiconductor device according to the second embodiment of the invention. In FIGS. 25 through 27, any constituents identical to those in the semiconductor device 40 of the second embodiment are denoted by identical reference numerals.

With reference to FIGS. 25 through 27, a manufacturing method of semiconductor devices 40 according to the second embodiment of the invention will be explained. First, process steps similar to those shown in FIGS. 12 through 14 explained in the first embodiment are performed, thereby to form a structure shown in FIG. 14.

Next, in a process step shown in FIG. 25, an anisotropic conductive resin 41 is formed so as to cover the internal connection terminals 12 and the surface of the plurality of semiconductor chips 11 (top surface of the plurality of semiconductor chips 11) on which the internal connection terminals 12 are provided (anisotropic conductive resin formation process). As for the anisotropic conductive resin, an adhesive sheet-type anisotropic conductive resin (i.e. ACF (Anisotropic Conductive Film)) or a paste-type anisotropic conductive resin (i.e. ACP (Anisotropic Conductive Paste)) etc. may be used.

When the paste-type anisotropic conductive resin (i.e. ACP (Anisotropic Conductive Paste)) is used as the anisotropic conductive resin 41, the paste-type anisotropic conductive resin is formed by a printing method, and then by prebaking the paste-type anisotropic conductive resin to a semi-cured state. This semi-cured anisotropic conductive resin has a function as an adhesive. The thickness $T_8$ of the anisotropic conductive resin 41 may for example be 20 μm to 100 μm.

Next, in a process step shown in FIG. 26, a metal layer 33 is formed on the top surface 41A of the anisotropic conductive resin 41 (metal layer formation process). More specifically, a Cu foil is provided as the metal layer 33, and this Cu foil is adhered onto the top surface 41A of the anisotropic conductive resin 41. The thickness $T_5$ of the metal layer 33 may for example be 10 μm.

Next, in a process step shown in FIG. 27, while heating the structure shown in FIG. 26, the metal layer 33 is pressed from the top surface 33A of the metal layer 33, to have the bottom surface 33B of the metal layer and the top surfaces 12A of the plurality of internal connection terminals 12 come into contact, and thereby to pressure-bond the metal layer 33 and the internal connection terminals 12 (pressure bonding process). Also, by heating the structure shown in FIG. 26, the anisotropic conductive resin 41 will cure. The thickness $T_7$ of the anisotropic conductive resin 41 after the pressure bonding may for example be 10 μm to 60 μm.

In this way, after forming the anisotropic conductive resin 41 so as to cover the internal connection terminals 12 and a surface of the plurality of semiconductor chips 11 (top surface of the plurality of semiconductor chips 11) on which the internal connection terminals 12 are provided, by forming the metal layer 33 intended for the wiring patterns 14, 15 over the anisotropic conductive resin 41, and pressing the metal layer 33 to pressure-bond the metal layer 33 and the plurality of internal connection terminals 12, the pressure to be applied when pressing the metal layer 33 may be smaller than the case where an insulating resin is used, so that the semiconductor devices 40 may easily be manufactured.

Thereafter, by performing process steps similar to the ones shown in FIGS. 18 through 22 explained in conjunction with the first embodiment, the plurality of semiconductor devices 40 are completed.

According to the manufacturing method of the present embodiment, after the formation of the anisotropic conductive resin 41 so as to cover the plurality of internal connection terminals 12 and a surface of the plurality of semiconductor chips 11 on which the internal connection terminals 12 are formed (top surface of the plurality of semiconductor chips 11), by forming the metal layer 33, which is intended for the wiring patterns 14, 15, on the anisotropic conductive resin 41, and pressing this metal layer to pressure-bond the metal layer 33 and the plurality of the internal connection terminals 12, the process to align the heights of the plurality of internal connection terminals 12, and the process to grind the anisotropic conductive resin 41 to expose top portions of the plurality of internal connection terminals 12 from the anisotropic conductive resin may be unnecessitated, so that the number of process steps may be reduced, allowing reduction in the manufacturing cost of the semiconductor device 40.

Furthermore, by providing the anisotropic conductive resin in the place of the insulating resin 13 provided on the semiconductor device 10 of the first embodiment, the pressure to be applied when pressing the metal layer 33 may be smaller, the semiconductor device 40 may easily be manufactured.

Embodiment 3

Figure 28:
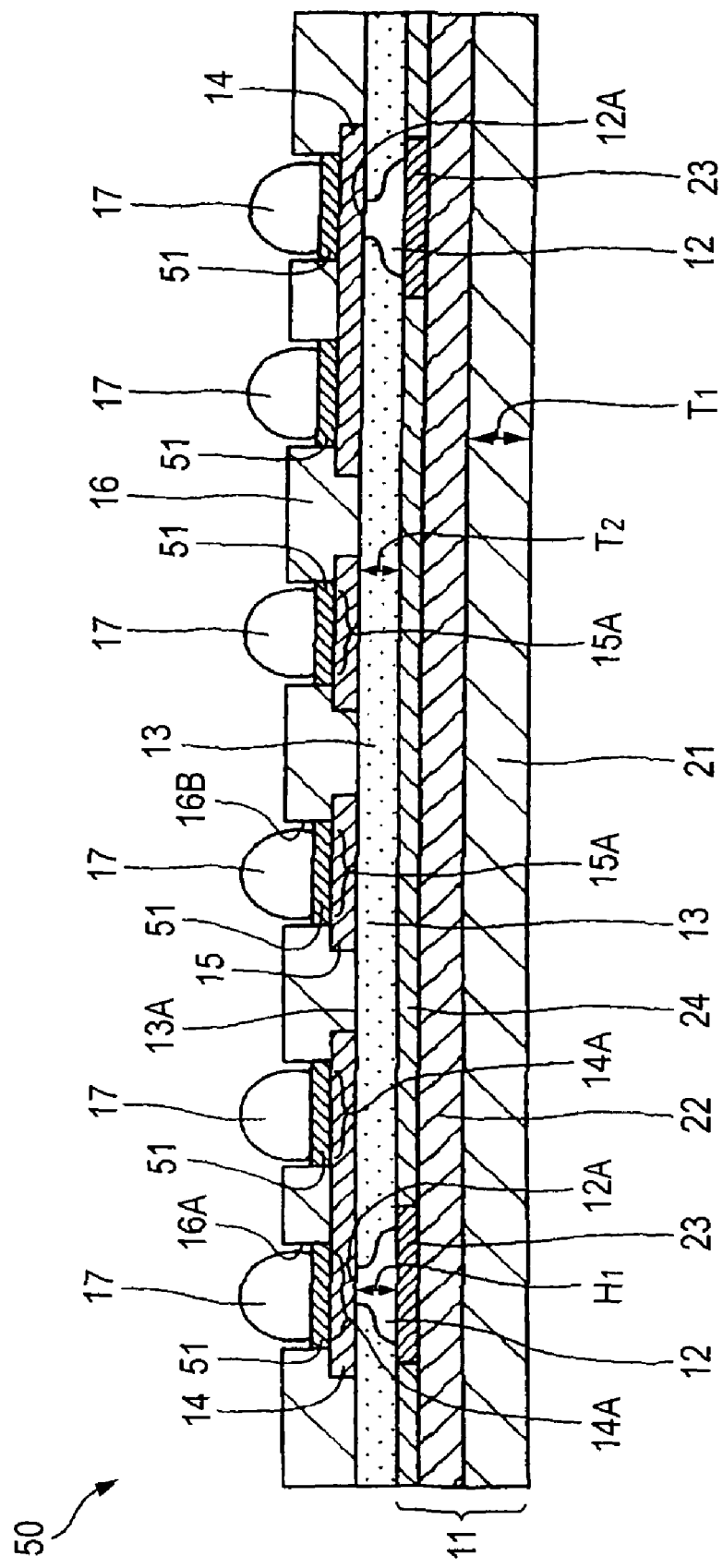
FIG. 28 is a cross-sectional view of a semiconductor device according to a third embodiment of the invention.

FIG. 28 is a cross-sectional view of a semiconductor device according to a third embodiment of the invention.

With reference to FIG. 28, a semiconductor device 50 of the third embodiment is configured in a similar manner as the semiconductor device 10 of the first embodiment, except that it has connection pads 51 provided in addition to the configuration of the semiconductor device 10.

The connection pads 51 are provided on the external connection terminal formation regions 14A, 15A of the wiring patterns 14, 15. The connection pads 51 are exposed from openings 16A, 16B formed within the solder mask 16. On the connection pads 51, the external connection terminals 17 are provided. As for a material of the connection pads 51, Sn, Ni, Ti or the like may be used. The thickness of the connection pads 51 may for example be 2 μm.

FIGS. 29 through 34 are views showing manufacturing steps of the semiconductor device according to the third embodiment of the invention. In FIGS. 29 through 34, any constituents identical to those in the semiconductor device 50 of the third embodiment are denoted by identical reference numerals.

With reference to FIGS. 28 through 34, the manufacturing method of the semiconductor device 50 according to the third embodiment of the invention will be explained. First, process steps similar to those shown in FIGS. 12 through 15 explained in the first embodiment are performed to form a structure shown in FIG. 15.

Figure 29:
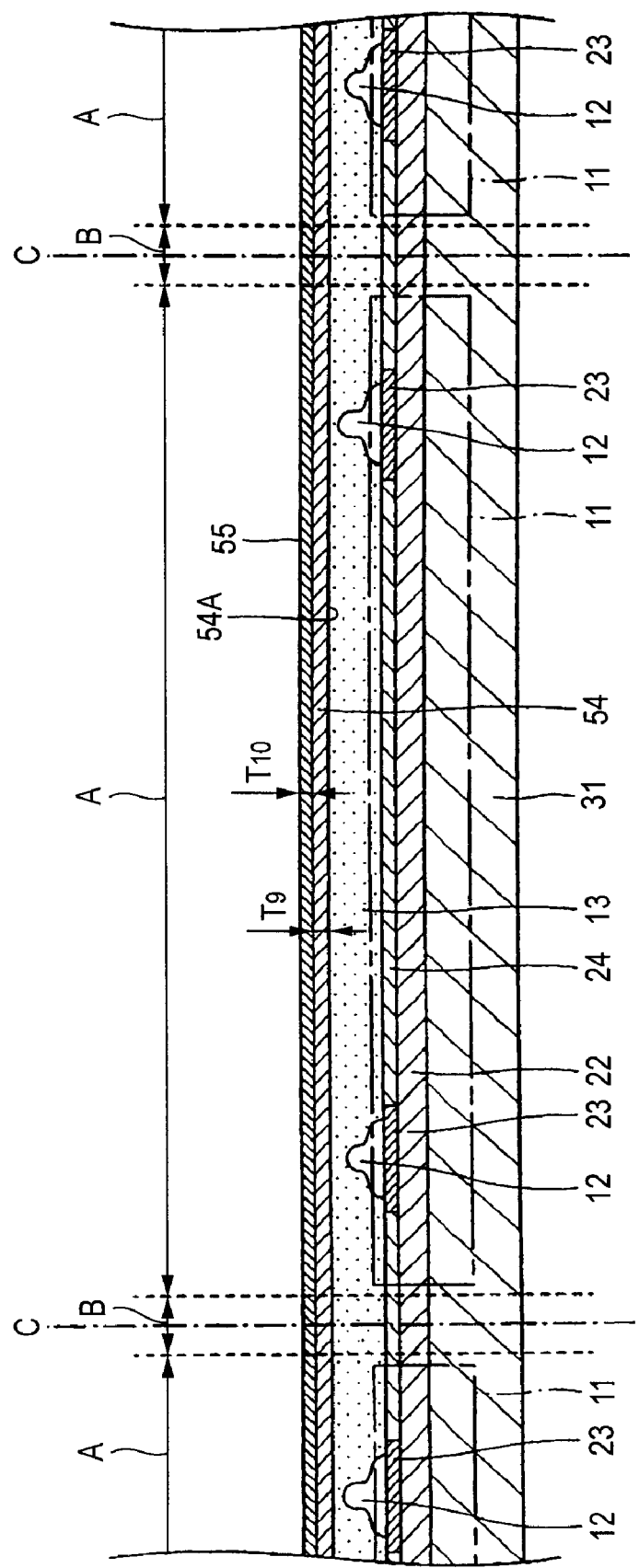
FIG. 29 shows a manufacturing process step (No. 1) of the semiconductor device according to the third embodiment of the invention.

Next, in a process step shown in FIG. 29, a first metal layer 54 and a second metal layer 55 are formed sequentially on the top surface 13A of the insulating resin 13 (metal layer lamination process). The first metal layer 54 is the metal layer to be patterned by etching to constitute the wiring patterns 14, 15. Also, the first metal layer acts as an etching stopper when etching the second metal layer 55. The second metal layer 55 is a metal layer to be patterned by etching to constitute the connection pads 51.

When, for example, an Sn layer, Ni layer or Ti layer is used as the second metal layer 55, a Cu layer or the like may be used as the first metal layer 54. More specifically, by adhering over the top surface 13A of the insulating resin 13, a sheet-like metal foil in which an Sn layer (equivalent to the second metal layer) is laminated on a Cu foil (equivalent to the first metal layer), the first and second metal layers are formed. The thickness $T_9$ of the first metal layer 54 may for example be 10 μm. The thickness $T_{10}$ of the second metal layer 55 may for example be 2 μm.

Figure 30:
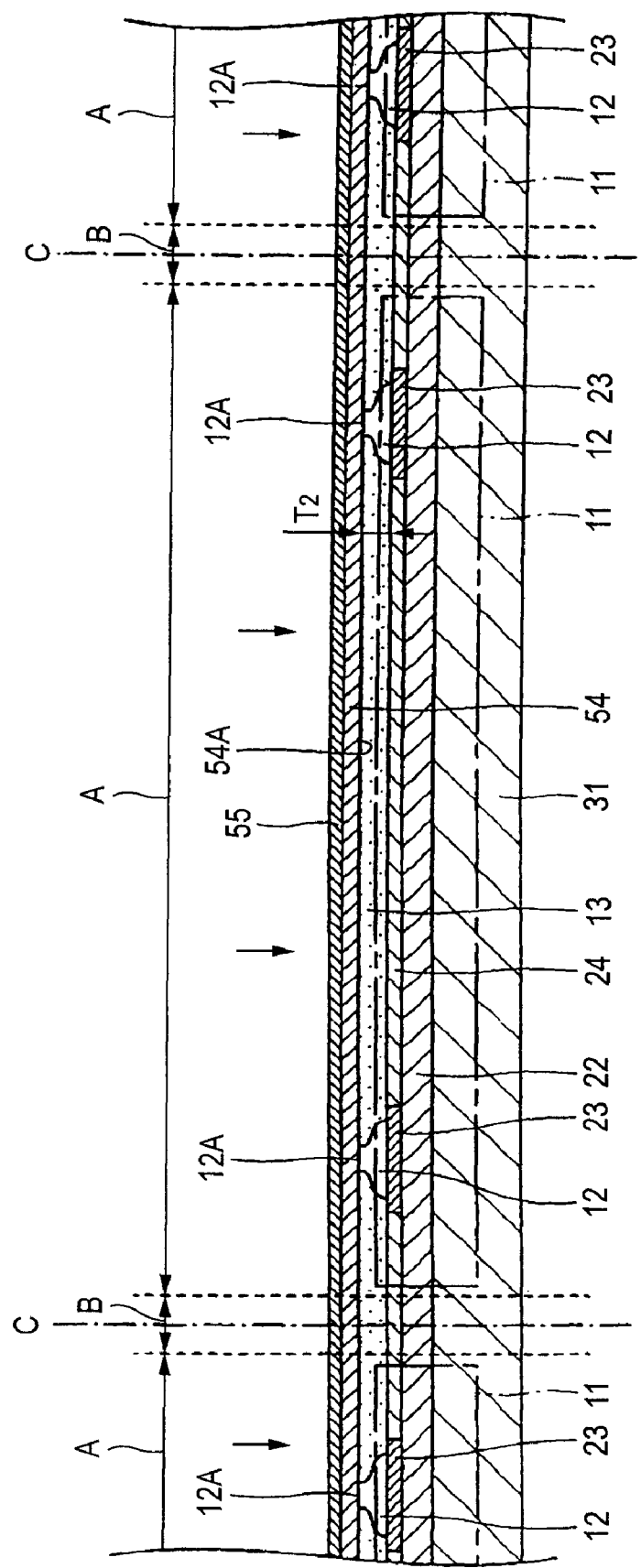
FIG. 30 shows a manufacturing process step (No. 2) of the semiconductor device according to the third embodiment of the invention.

Next, in a process step shown in FIG. 30, while heating the structure shown in FIG. 29, the second metal layer 55 is pressed to have the bottom surface 54A of the first metal layer 54 and the top surfaces 12A of the plurality of internal connection terminals 12 come into contact, thereby to have the first metal layer 54 and the internal connection terminals 12 pressure-bonded (pressure bonding process). Also, by heating the structure shown in FIG. 29, the insulating resin 13 will cure. The thickness $T_2$ of the insulating resin 13 after the pressure bonding may for example be 10 μm to 60 μm.

In this way, by pressing the second metal layer 55 to pressure-bond the first metal layer 54 and the plurality of internal connection terminals 12, the process to align the heights of the plurality of internal connection terminals, and the process to grind the insulating resin 13 to expose the top portions of the plurality of internal connection terminals 12 from the insulating resin may be unnecessitated, and thus the number of process steps may be reduced, allowing reduction in the manufacturing cost of the semiconductor device 50.

Figure 31:
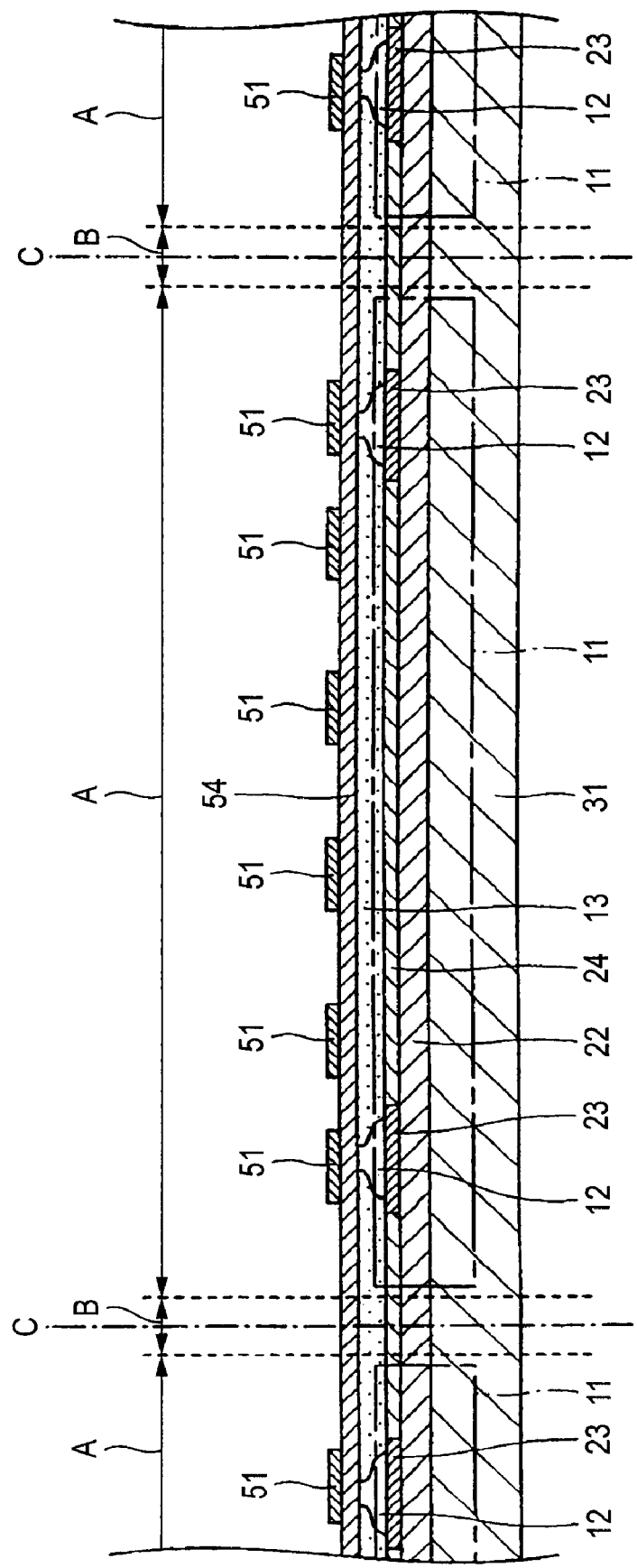
FIG. 31 shows a manufacturing process step (No. 3) of the semiconductor device according to the third embodiment of the invention.

Next, in a process step shown in FIG. 31, the second metal layer 55 is patterned through etching to form connection pads 51 over the first metal layer 54 in the portions corresponding to the external connection terminal formation regions 14A, 15A (connection pad formation process). More specifically, a patterned resist film is formed over the second metal layer 55, and by using this resist film as a mask, the second metal layer 55 is etched through anisotropic etching, thereby forming the connection pads 51.

At this point of time, the first metal layer 54 works as an etching stopper during the etching of the second metal layer 55, so that the insulating resin 13 may be prevented from being etched.

Figure 32:
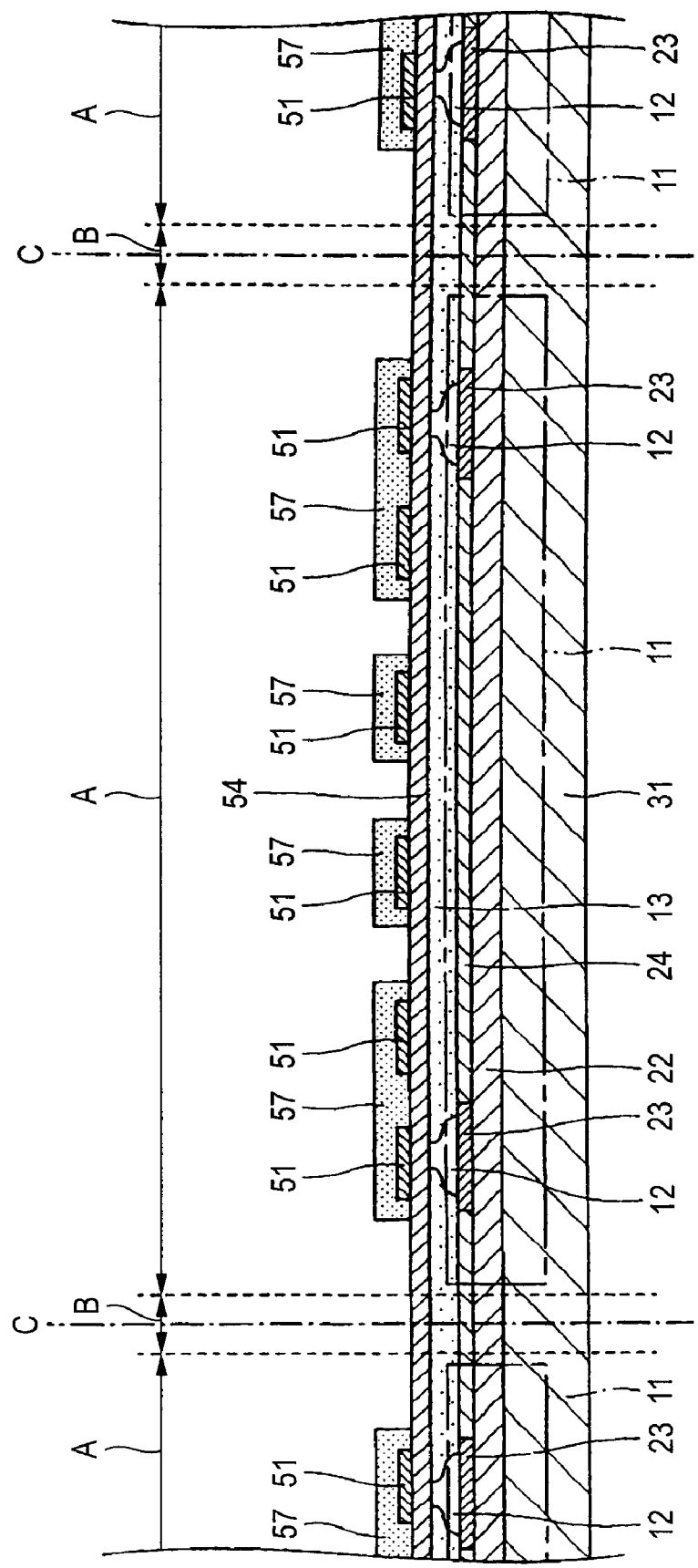
FIG. 32 shows a manufacturing process step (No. 4) of the semiconductor device according to the third embodiment of the invention.

Next, in a process step shown in FIG. 32, a patterned resist film 57 is formed over the structure shown in FIG. 31. The resist film 57 is a mask used when etching the first metal layer 54 to form the wiring patterns 14, 15.

Figure 33:
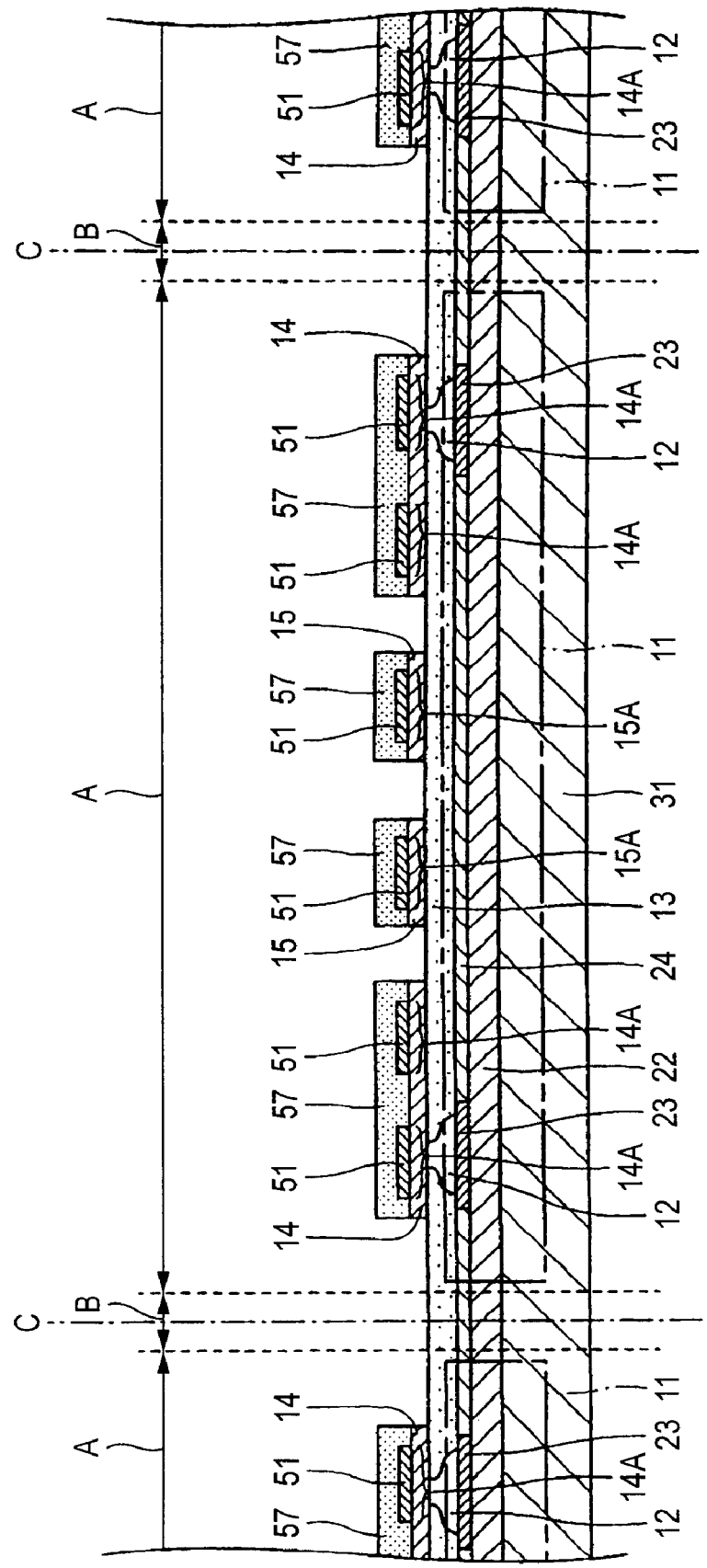
FIG. 33 shows a manufacturing process step (No. 5) of the semiconductor device according to the third embodiment of the invention.

Next, in a process step shown in FIG. 33, by using the resist film 57 as the mask, the first metal layer 54 is etched to form the wiring patterns 14, 15 (wiring pattern formation process).

Figure 34:
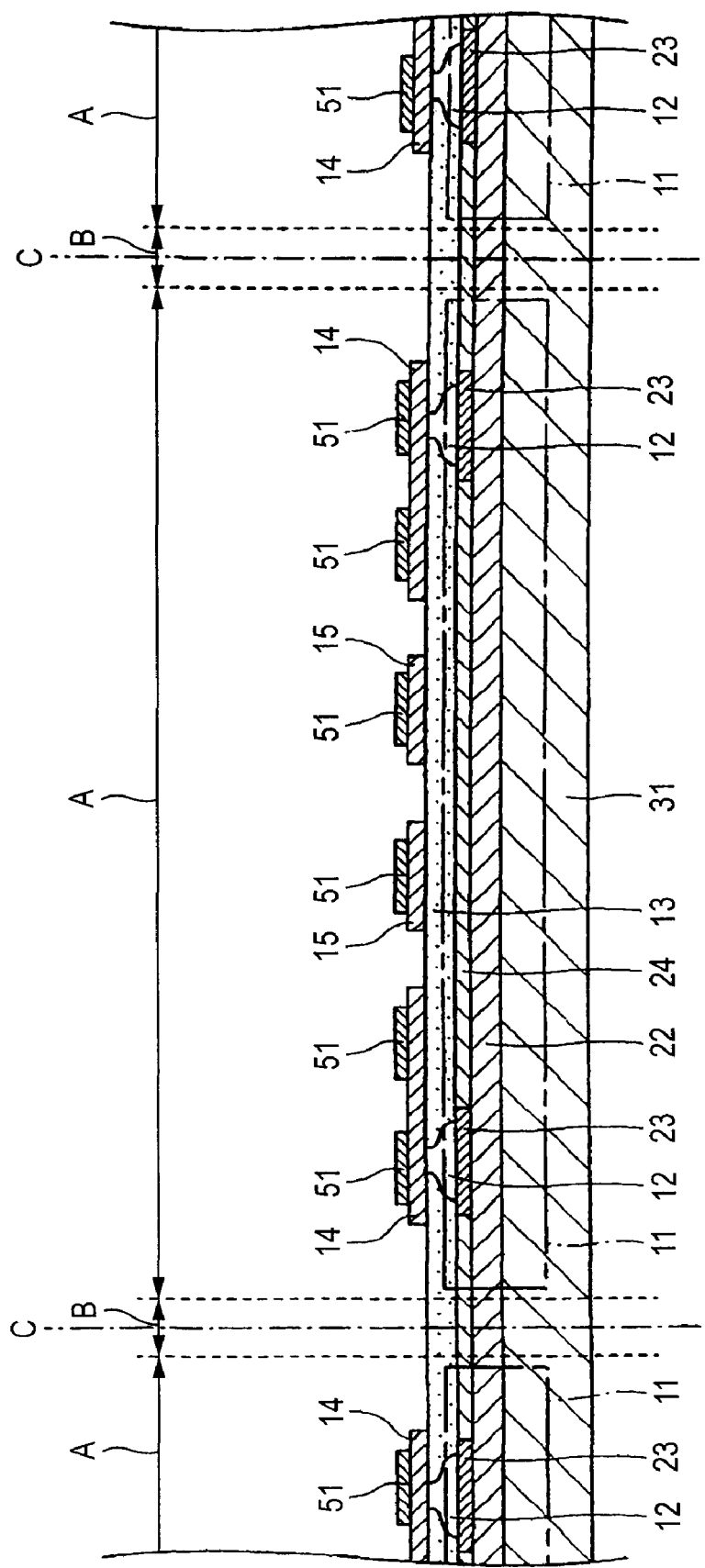
FIG. 34 shows a manufacturing process step (No. 6) of the semiconductor device according to the third embodiment of the invention.

Next, in a process step shown in FIG. 34, the resist film 57 is eliminated. Thereafter, by performing process steps similar to those shown in FIGS. 20 through 22 explained in conjunction with the first embodiment, a plurality of semiconductor devices 50 are completed.

According to the manufacturing method of the semiconductor devices of the present embodiment, after the formation of the insulating resin 13 so as to cover the plurality of internal connection terminals 12 and a surface of the plurality of semiconductor chips 11 (top surface of the plurality of semiconductor chips 11) on which the internal connection terminals 12 are formed, by sequentially forming the first metal layer 54, which is intended for the wiring patterns 14, 15, over the insulating resin 13 and the second metal layer 55, which is intended for the connection pads 51, and pressing the second metal layer 55 to pressure-bond the first metal layer 54 and the plurality of the internal connection terminals 12, the process to align the heights of the plurality of internal connection terminals 12, and the process to grind the insulating resin 13 to expose the top portions of the plurality of internal connection terminals 12 from the insulating resin may be unnecessitated, so that the number of process steps may be reduced, allowing reduction in the manufacturing cost of the semiconductor device 50.

In the present embodiment of the semiconductor device 50, it is explained as having the insulating resin 13 provided between the wiring patterns 14, 15 and the semiconductor chips 11, however, the anisotropic conductive resin 41 explained in accordance with the second embodiment may be used instead of the insulating resin 13. In this case, the effects similar to those obtained by the manufacturing method of the semiconductor devices 40 according to the second embodiment may be obtained.

Figure 35:
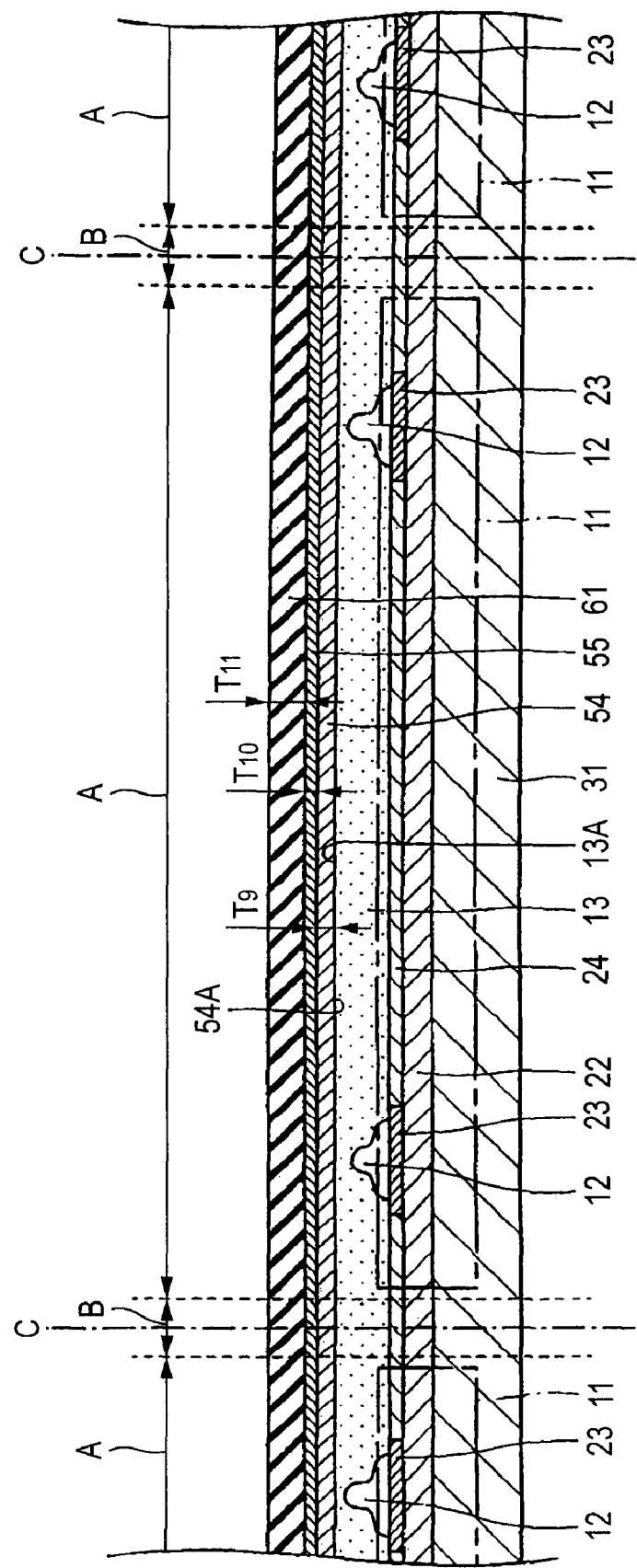
FIG. 35 shows a manufacturing process step (No. 1) of the semiconductor device according to a modified version of the third embodiment of the invention.
Figure 36:
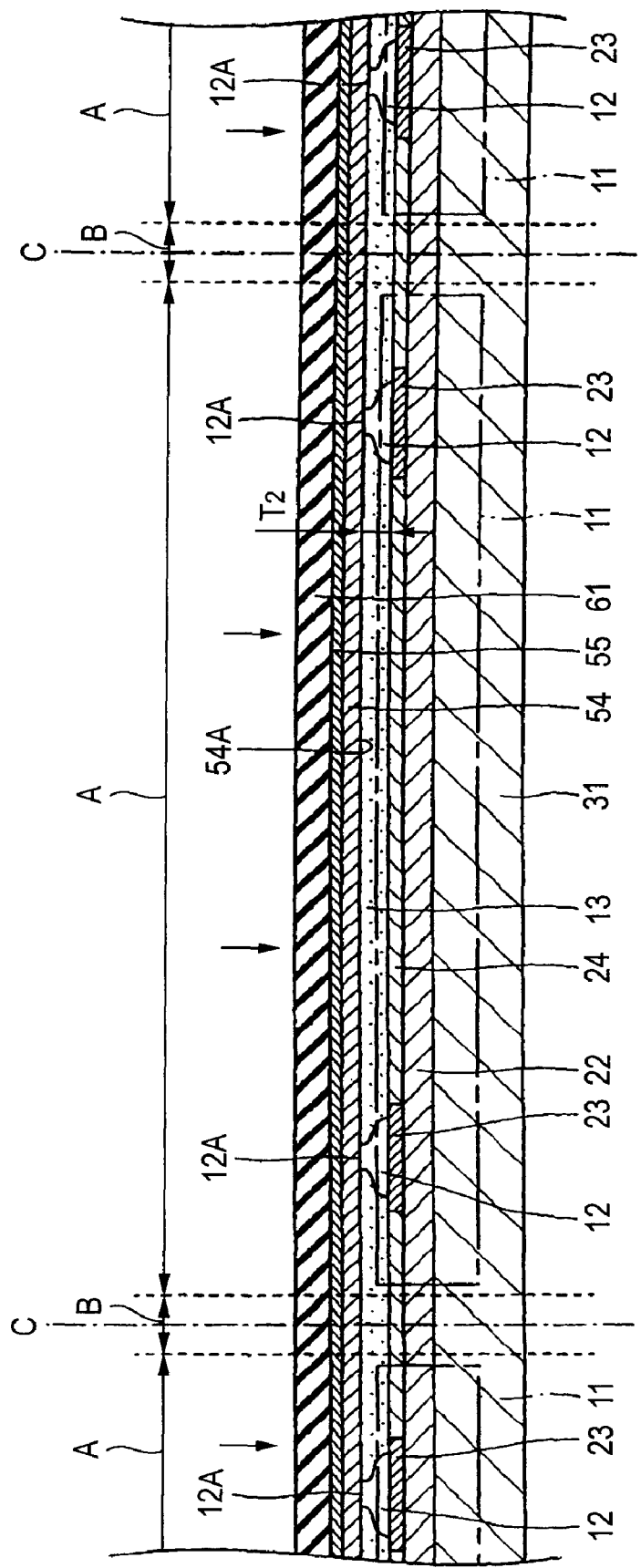
FIG. 36 shows a manufacturing process step (No. 2) of the semiconductor device according to the modified version of the third embodiment of the invention.
Figure 37:
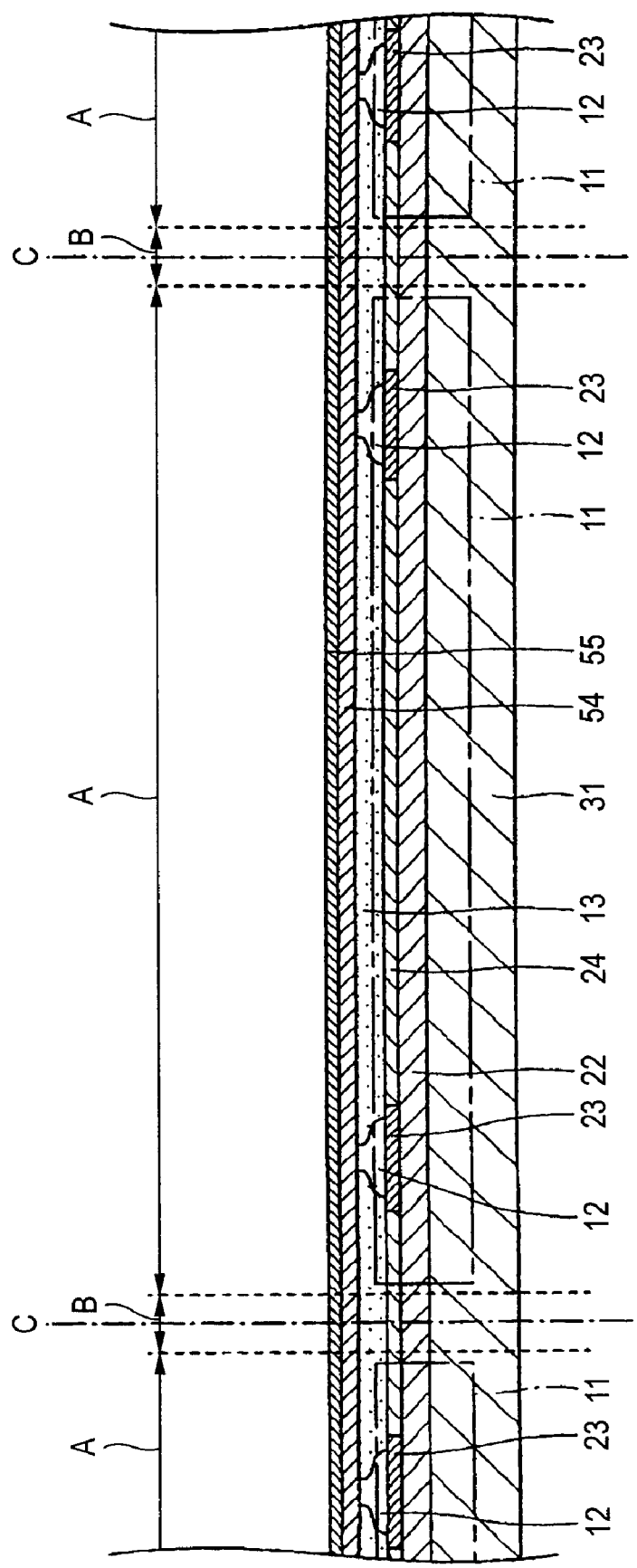
FIG. 37 shows a manufacturing process step (No. 3) of the semiconductor device according to the modified version of the third embodiment of the invention.

FIGS. 35 through 37 show a modified version of the manufacturing steps of the semiconductor device according to the third embodiment of the invention. In FIGS. 35 through 37, any constituents identical to those in the semiconductor devices shown in FIG. 29 are denoted by identical reference numerals.

With reference FIGS. 35 through 37, a modified version of the manufacturing method of the semiconductor device 50 according to the third embodiment of the invention will be explained. First, by performing process steps identical to those shown in FIGS. 12 through 15 explained in conjunction with the first embodiment, the structure shown in FIG. 15 is formed.

Next, in a process step shown in FIG. 35, a first metal layer 54, a second metal layer 55 and a protective layer 61 are formed sequentially on the top surface 13A of the insulating resin 13 (layer lamination process). The protective layer 61 is one for protecting the second metal layer 55. The protective layer 61 is adhered on to the second metal layer 55 using an adhesive which has a low adhesion. Accordingly, the protective layer 61 is configured to be easily peeled off from the second metal layer 55. As for the protective layer 61, a Cu foil may for example be used. Moreover, the thickness $T_{11}$ of the protective layer 61 may for example be 35 μm to 100 μm.

Next, in a process step shown in FIG. 36, while heating the structure shown in FIG. 35, the protective layer 61 is pressed to have the bottom surface 54A of the first metal layer 54 and the top surfaces 12A of the plurality of internal connection terminals 12 come into contact, thereby to have the first metal layer 54 and the internal connection terminals 12 pressure-bonded (pressure bonding process). Also, by heating the structure shown in FIG. 35, the insulating resin 13 will cure. The thickness $T_2$ of the insulating resin 13 after the pressure bonding may for example be 10 μm to 60 μm.

In this way, by pressing the protective layer 61 provided on the second metal layer 55 to pressure-bond the first metal layer 54 which is to constitute the wiring patterns 14, 15 and the plurality of internal connection terminals 12, the second metal layer having a small thickness may be prevented from being damaged.

Next, in a process step shown in FIG. 37, the protective layer 61 is eliminated (protective layer elimination process). Thereafter, by performing process steps similar to those explained with reference to FIGS. 31 through 34, and then performing process steps similar to those explained with reference to FIGS. 20 through 22 in conjunction with the first embodiment, a plurality of semiconductor devices 50 are completed.

According to this modified version of the present embodiment of the manufacturing method of the semiconductor device, by forming the protective layer 61 on the second metal layer 55, and by pressing this protective layer 61 to pressure-bond the first metal layer 54, which is intended for the wiring patterns 14, 15, and the plurality of internal connection terminals 12, the second metal layer having a small thickness may be prevented from being damaged.

Embodiment 4

Figure 38:
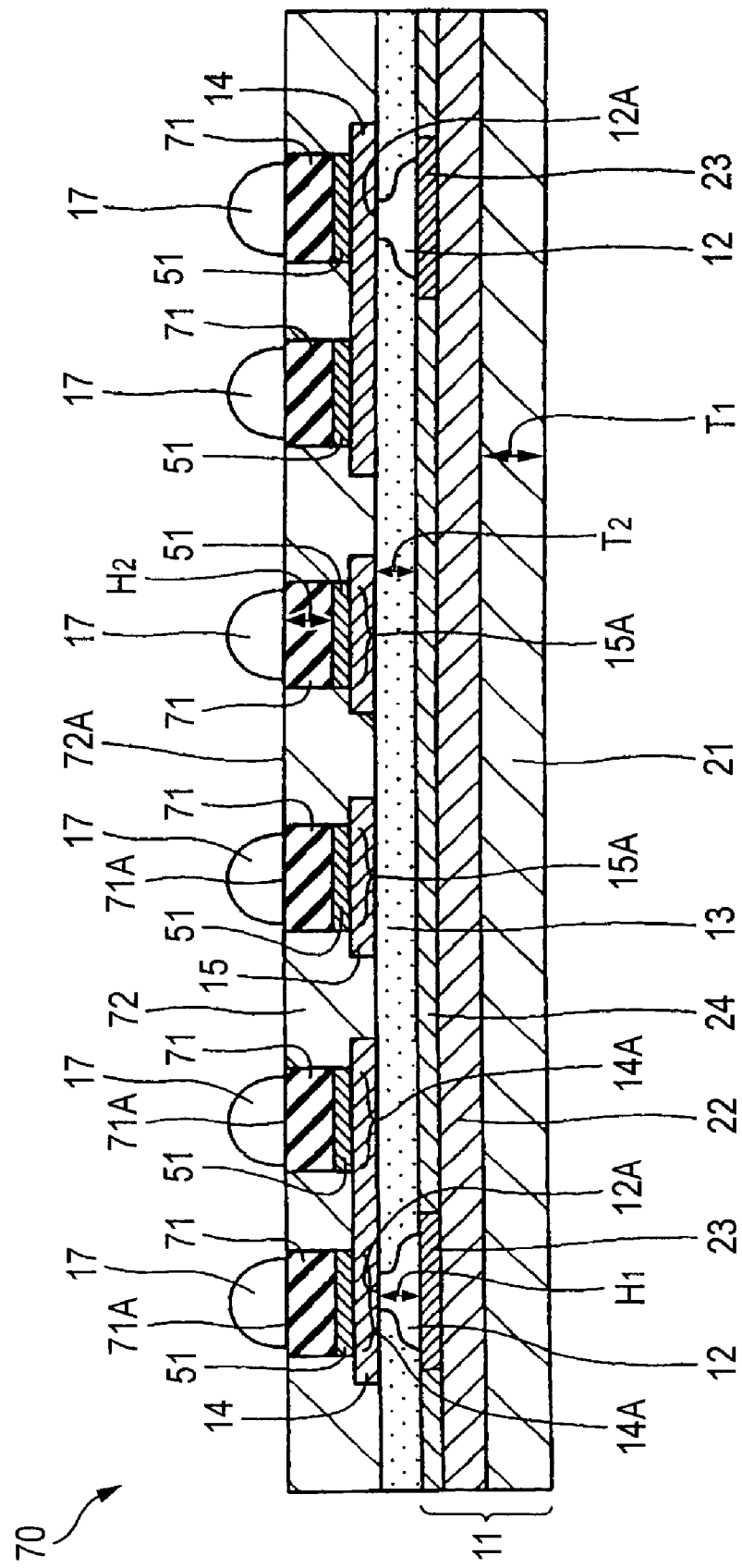
FIG. 38 is a cross-sectional view of a semiconductor device according to a fourth embodiment of the invention.

FIG. 38 is a cross-sectional view of a semiconductor device according to a fourth embodiment of the invention.

With reference to FIG. 38, the semiconductor device 70 of the fourth embodiment is configured in a similar manner as the semiconductor device 50 of the third embodiment, except that it has an encapsulation resin 72 in the place of the solder resist 16, and at the same time, it further includes metal posts 71.

The metal posts 71 are provided over the connection pads 51. The sides of the metal posts 71 are covered by the encapsulation resin 72. Top surfaces 71A of the metal posts 71 are exposed from the encapsulation resin 72. The top surfaces 71A of the metal posts 71 are approximately flush with the top surface 72A of the encapsulation resin 72. On the top surfaces 71A of the metal posts 71, the external connection terminals 17 are provided.

The metal posts 71 are electrically connected to the external connection terminals 17 and the connection pads 51. The metal posts 71 have a function to alleviate the stress (force) that the external connection terminals 17 may suffer when they are connected to a mounting board (not shown) such as a motherboard. As for a material of the metal posts 71, Cu may for example be used. The height $H_2$ of the metal posts 71 may be 50 μm to 100 μm.

The encapsulation resin 72 is provided on the insulating resin 13 so as to cover the sides of the wiring patterns 14, 15, the connection pads 51 and the metal posts 71. As for the encapsulation resin 72, an epoxy resin formed by a transfer molding method or a compression molding method may for example be used.

FIGS. 39 through 49 are views showing manufacturing steps of the semiconductor device according to the fourth embodiment of the invention. In FIGS. 39 through 49, any constituents identical to those in the structure shown in FIG. 35 are denoted by identical reference numerals.

With reference to FIGS. 39 through 49, a manufacturing method of the semiconductor devices 70 of the fourth embodiment will be explained. First, process steps similar to those shown in FIGS. 12 through 15 explained with reference to the first embodiment are performed to form the structure shown in FIG. 15.

Figure 39:
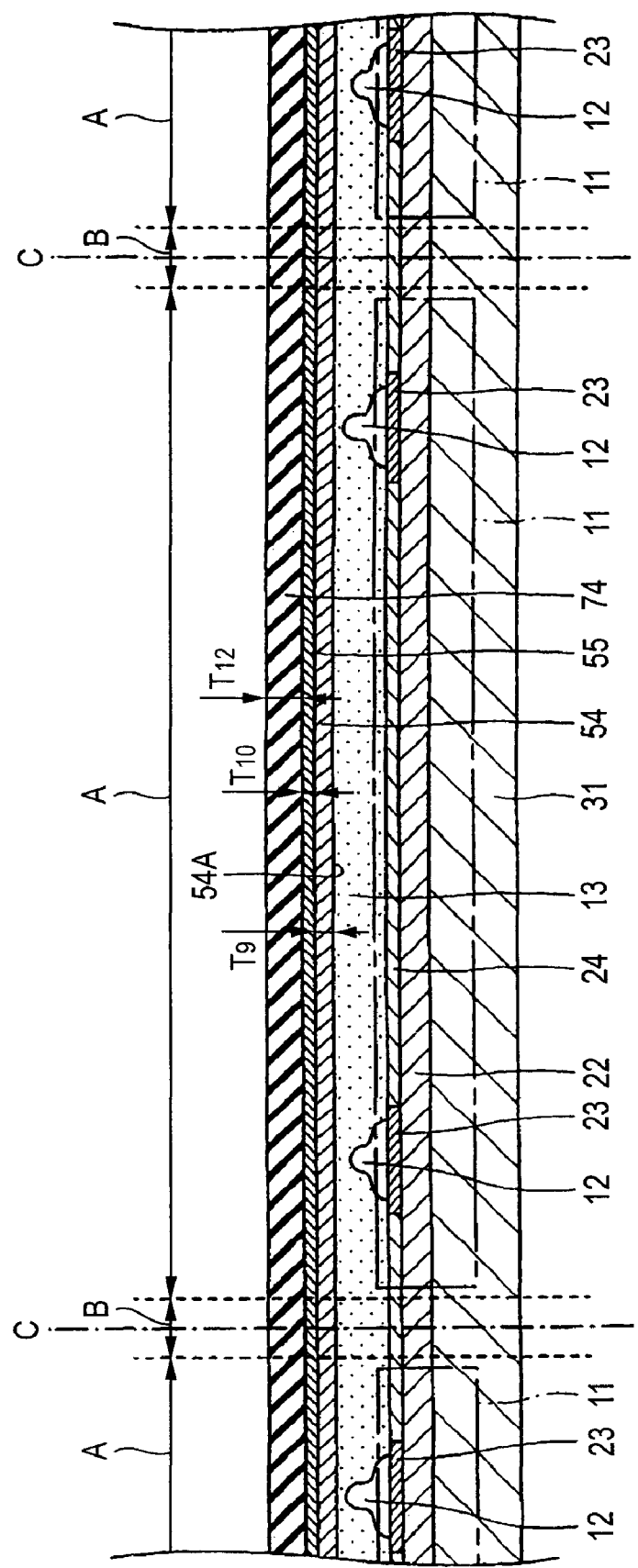
FIG. 39 shows a manufacturing process step (No. 1) of the semiconductor device according to the fourth embodiment of the invention.

Next, in a process step shown in FIG. 39, a first metal layer 54, a second metal layer 55 and a third metal layer 74 are formed sequentially on the top surface 13A of the insulating resin 13 (metal layer lamination process). The third metal layer 74 is one for protecting the second metal layer 55. The first metal layer 54 works as an etching stopper while the second metal layer 55 is being etched to constitute connection pads 51. As for a material of the first metal layer 54, Cu may for example be used. The thickness $T_9$ of the first metal layer 54 may for example be 10 μm.

The second metal layer 55 works as an etching stopper while the third metal layer 74 is being etched to constitute the metal posts 71. As for a material of the second metal layer 55, Sn, Ni or Ti may for example be used. The thickness $T_{10}$ of the second metal layer 55 may for example be 2 μm.

The third metal layer 74 is a metal layer to constitute the metal posts 71 after being patterned by etching. As for a material of the third metal layer 74, Cu may for example be used. The thickness $T_{12}$ of the third metal layer 74 may for example be 50 μm to 100 μm.

For example, by adhering over the top surface 13A of the insulating resin 13, a sheet-type metal foil constituted by a lamination of a Cu foil (equivalent to the first metal layer 54), an Sn layer (equivalent to the second metal layer 55), and another Cu foil (equivalent to the third metal layer 74), the first to the third metal layers 54, 55, 74 are formed.

Figure 40:
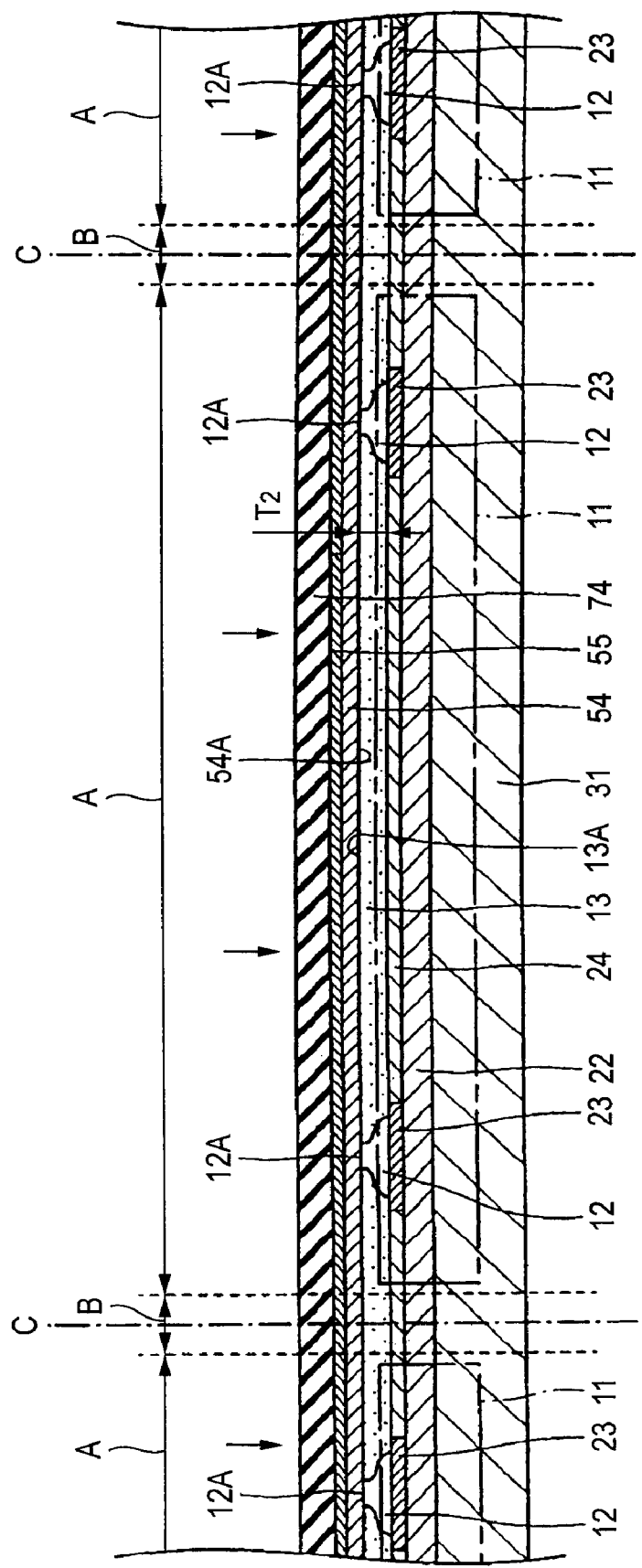
FIG. 40 shows a manufacturing process step (No. 2) of the semiconductor device according to the fourth embodiment of the invention.

Next, in a process step shown in FIG. 40, while heating the structure shown in FIG. 39, the third metal layer 74 is pressed to have the bottom surface 54A of the first metal layer 54 and the top surfaces 12A of the plurality of internal connection terminals 12 come into contact, and to pressure-bond the first metal layer 54 and the internal connection terminals 12 (pressure bonding process). Also, by heating the structure shown in FIG. 39, the insulating resin 13 will cure. The thickness $T_2$ of the insulating resin 13 after the pressure bonding may for example be 10 μm to 60 μm.

In this way, after the formation of the insulating resin 13 so as to cover the plurality of internal connection terminals 12 and the surface of the plurality of semiconductor chips 11 on which the internal connection terminals 12 are provided, by sequentially forming the first metal layer 54, which is intended for the wiring patterns 14, 15, the second metal layer 55 and the third metal layer 74 on the insulating resin 13 and pressing the third metal layer 74 to pressure-bond the first metal layer 54 and the plurality of the internal connection terminals 12, the process to align the heights of the plurality of internal connection terminals 12, and the process to grind the insulating resin 13 to expose the portions of the plurality of internal connection terminals 12 from the insulating resin 13 may be unnecessitated, so that the number of process steps may be reduced, allowing reduction in the manufacturing cost of the semiconductor device 70.

Figure 41:
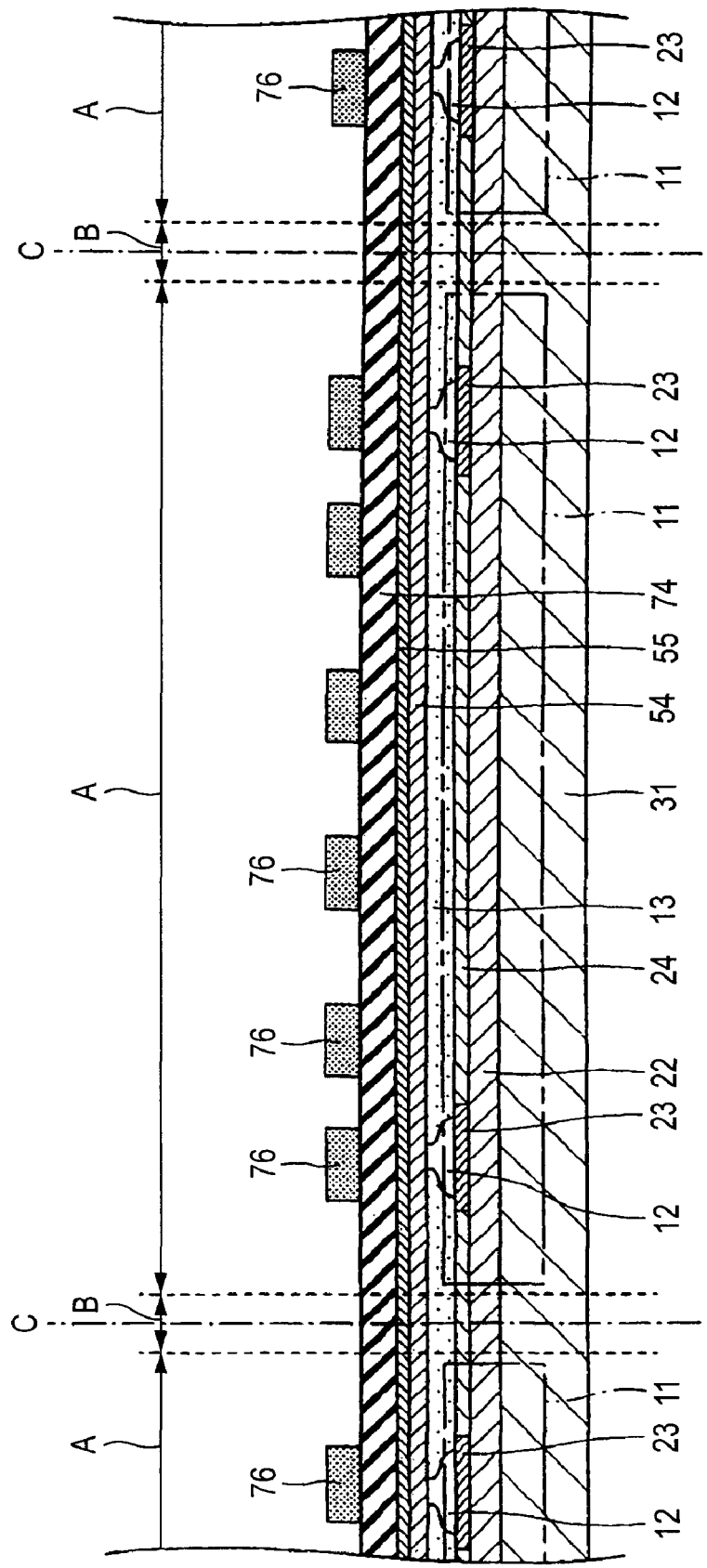
FIG. 41 shows a manufacturing process step (No. 3) of the semiconductor device according to the fourth embodiment of the invention.
Figure 42:
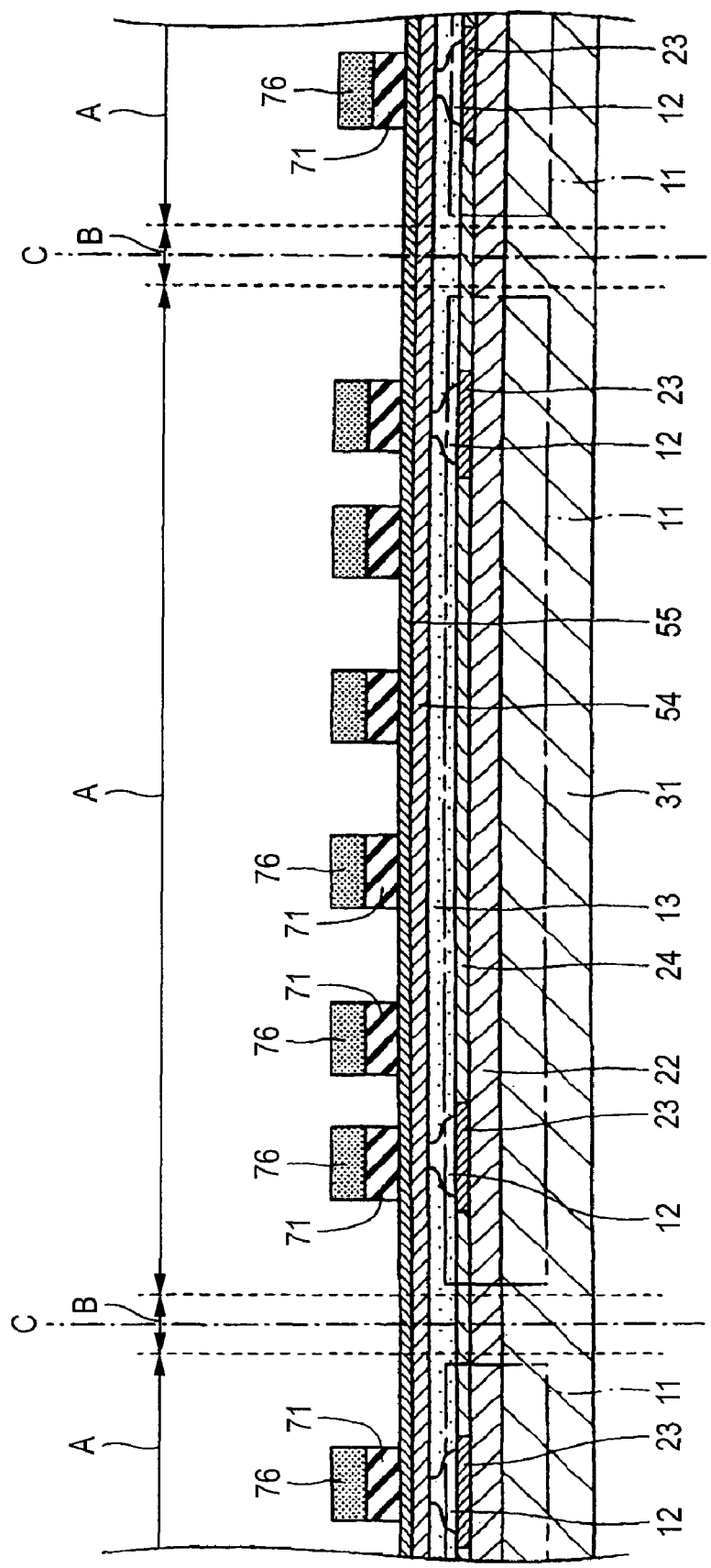
FIG. 42 shows a manufacturing process step (No. 4) of the semiconductor device according to the fourth embodiment of the invention.

Next, in a process step shown in FIG. 41, a patterned resist film 76 is formed over portions of the third metal layer 74 which correspond to the formation regions of the metal posts 71. Then, in a process step shown in FIG. 42, using the resist film 76 as a mask, the third metal layer 74 is etched to form the metal posts 71 in the portions below the resist film 76 (metal post formation process).

At this point of time, the second metal layer 55 works as an etching stopper when etching the third metal layer 74, so that etching of the second metal layer 55 is prevented while the third metal layer 74 is being etched.

Figure 43:
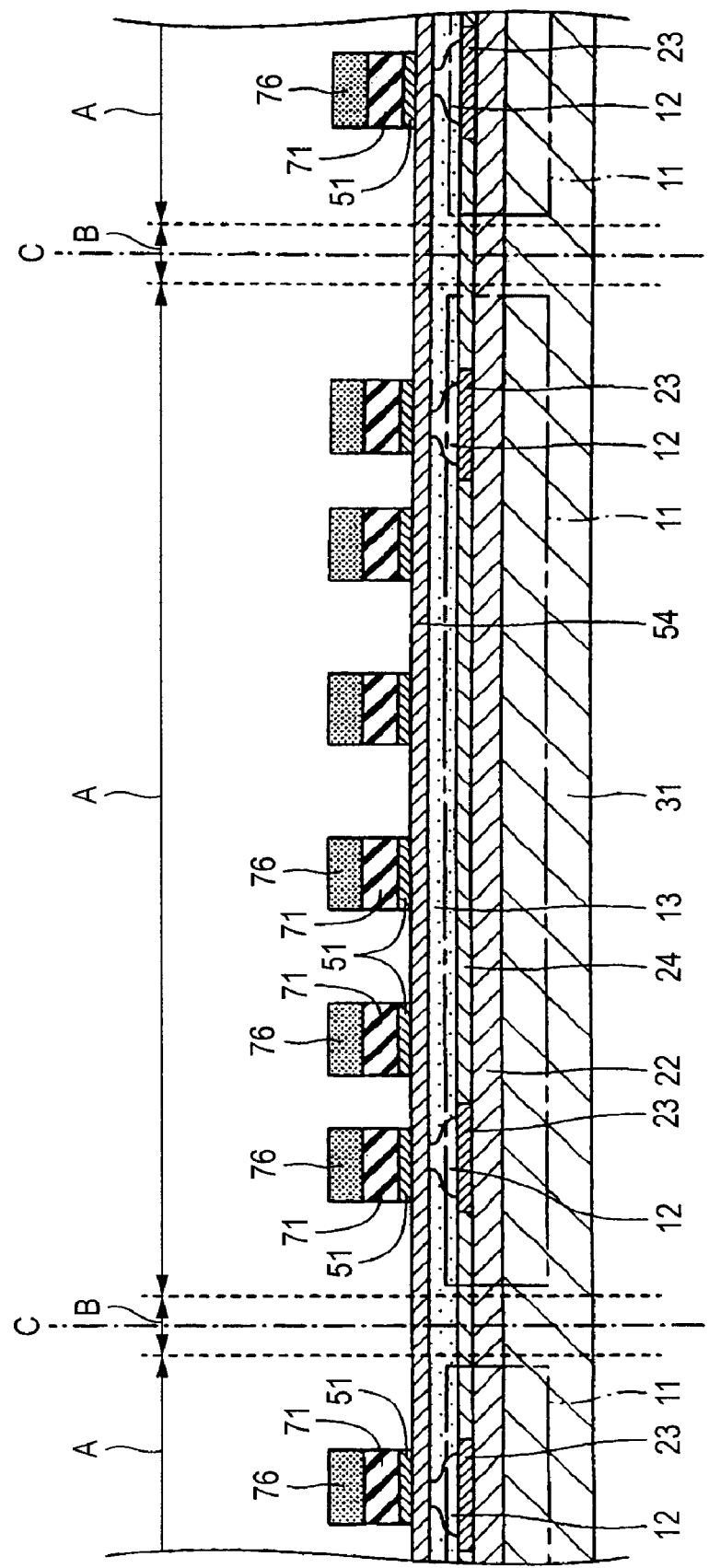
FIG. 43 shows a manufacturing process step (No. 5) of the semiconductor device according to the fourth embodiment of the invention.

Next, in a process step shown in FIG. 43, using the resist film 76 as a mask, the second metal layer 55 is etched to form connection pads 51 (connection pad formation process).

At this point of time, the first metal layer 54 works as an etching stopper when the second metal layer 55 is being etched, so that etching of the first metal layer 54 is prevented while the second metal layer 55 is being etched.

Figure 44:
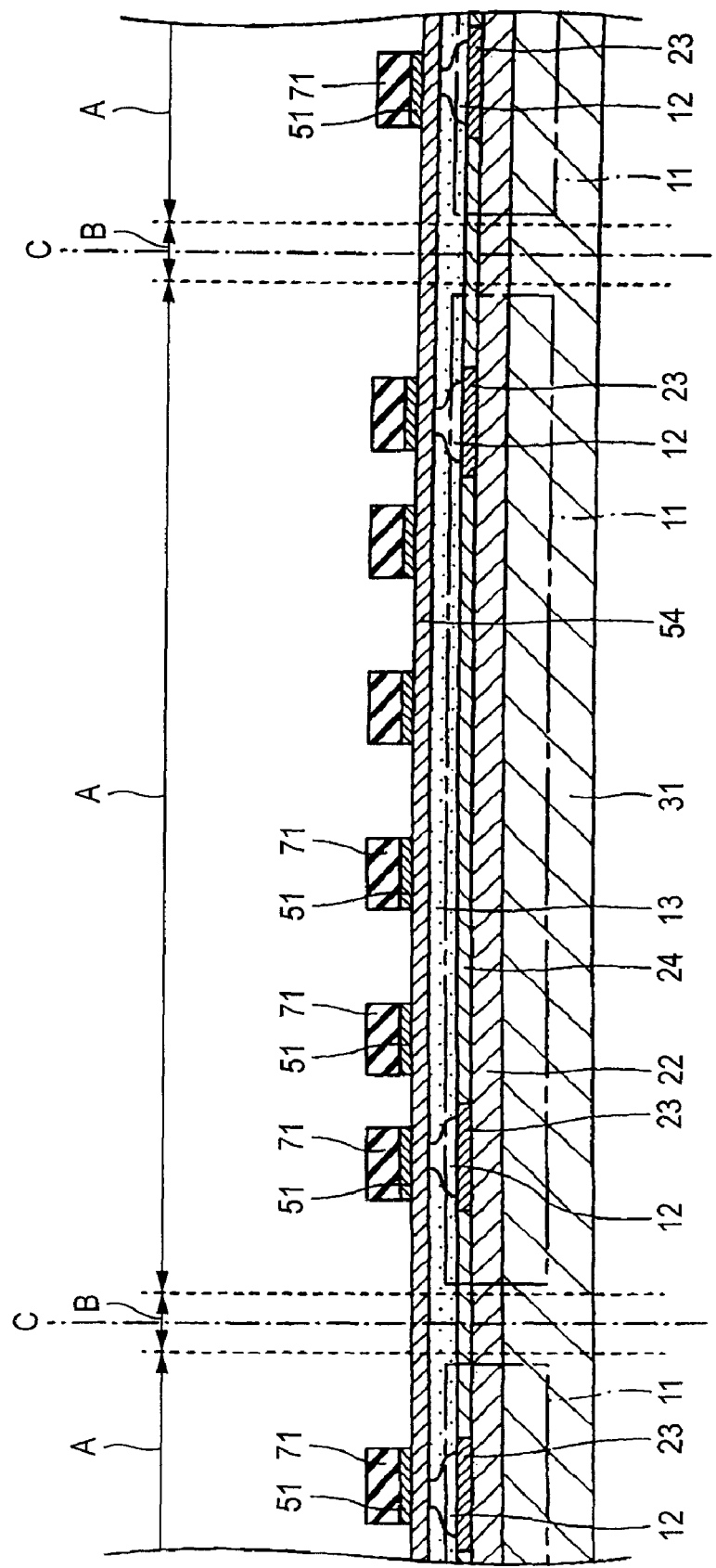
FIG. 44 shows a manufacturing process step (No. 6) of the semiconductor device according to the fourth embodiment of the invention.
Figure 45:
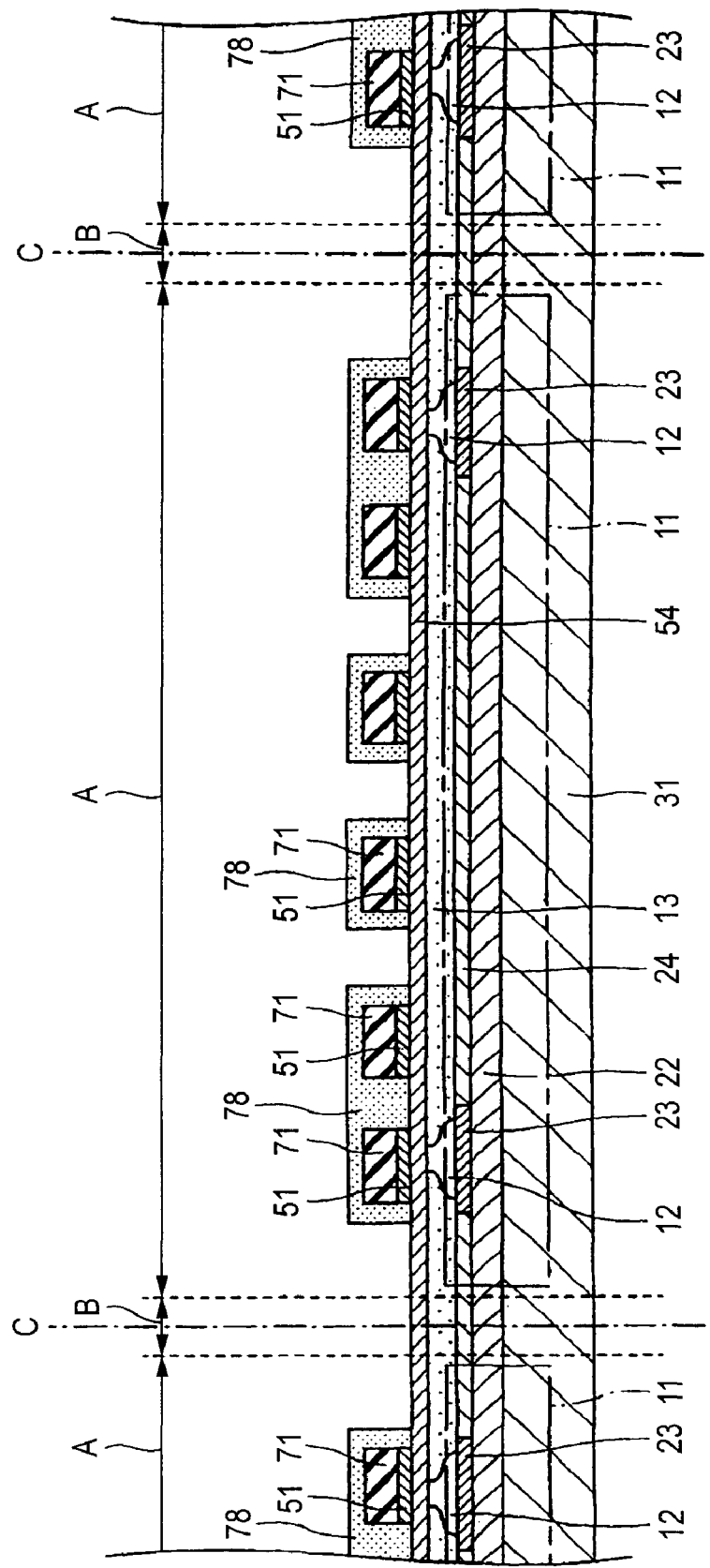
FIG. 45 shows a manufacturing process step (No. 7) of the semiconductor device according to the fourth embodiment of the invention.

Next, in a process step shown in FIG. 44, the resist film 76 is eliminated. Then, in a process step shown in FIG. 45, a patterned resist film 78 is formed over the structure shown in FIG. 44. The resist film 78 is a mask for forming the wiring patterns 14, 15 through etching the first metal layer 54.

Figure 46:
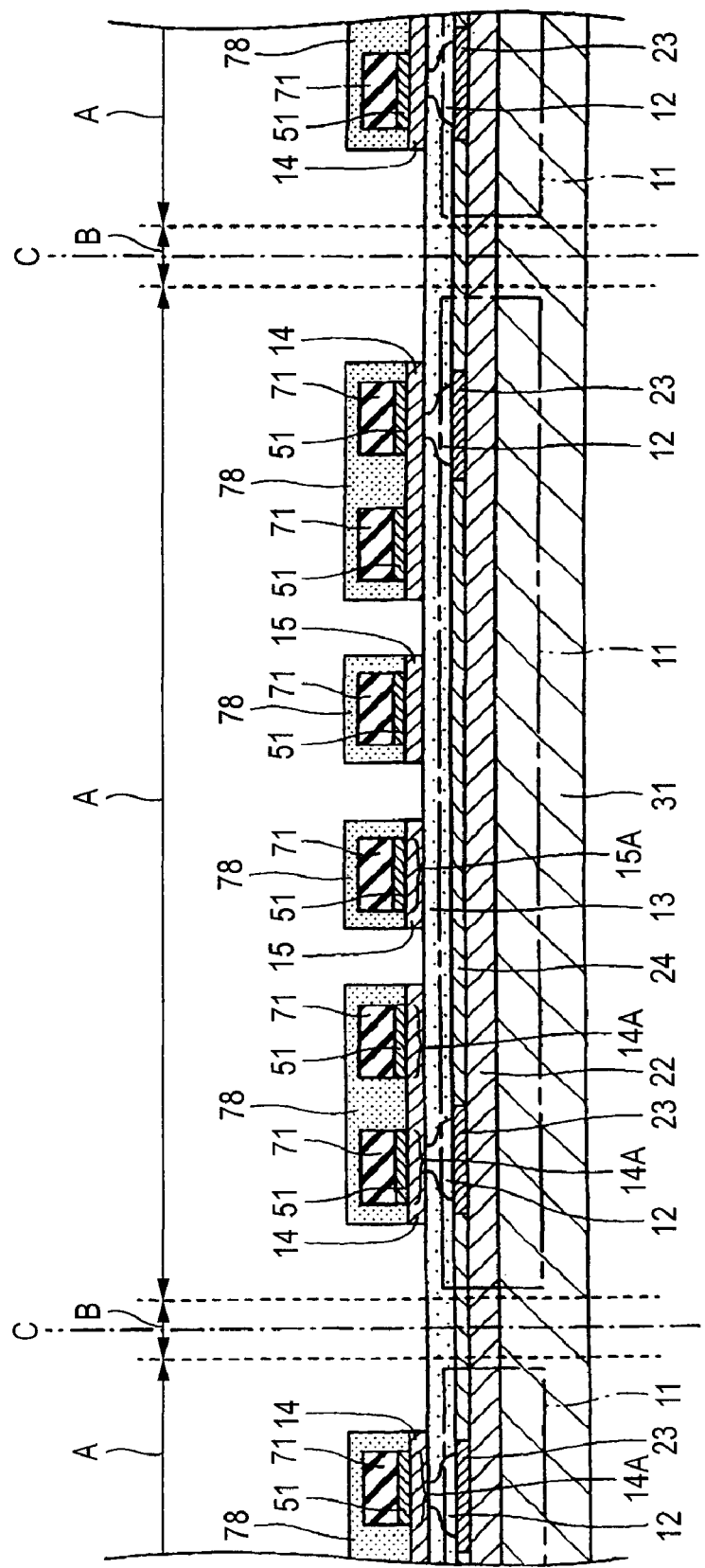
FIG. 46 shows a manufacturing process step (No. 8) of the semiconductor device according to the fourth embodiment of the invention.

Next, in a process step shown in FIG. 46, using the resist film 78 as a mask, the first metal layer is etched to form the wiring patterns 14, 15 (wiring pattern formation process). Then, in a process step shown in FIG. 47, the resist film 78 is eliminated.

Figure 47:
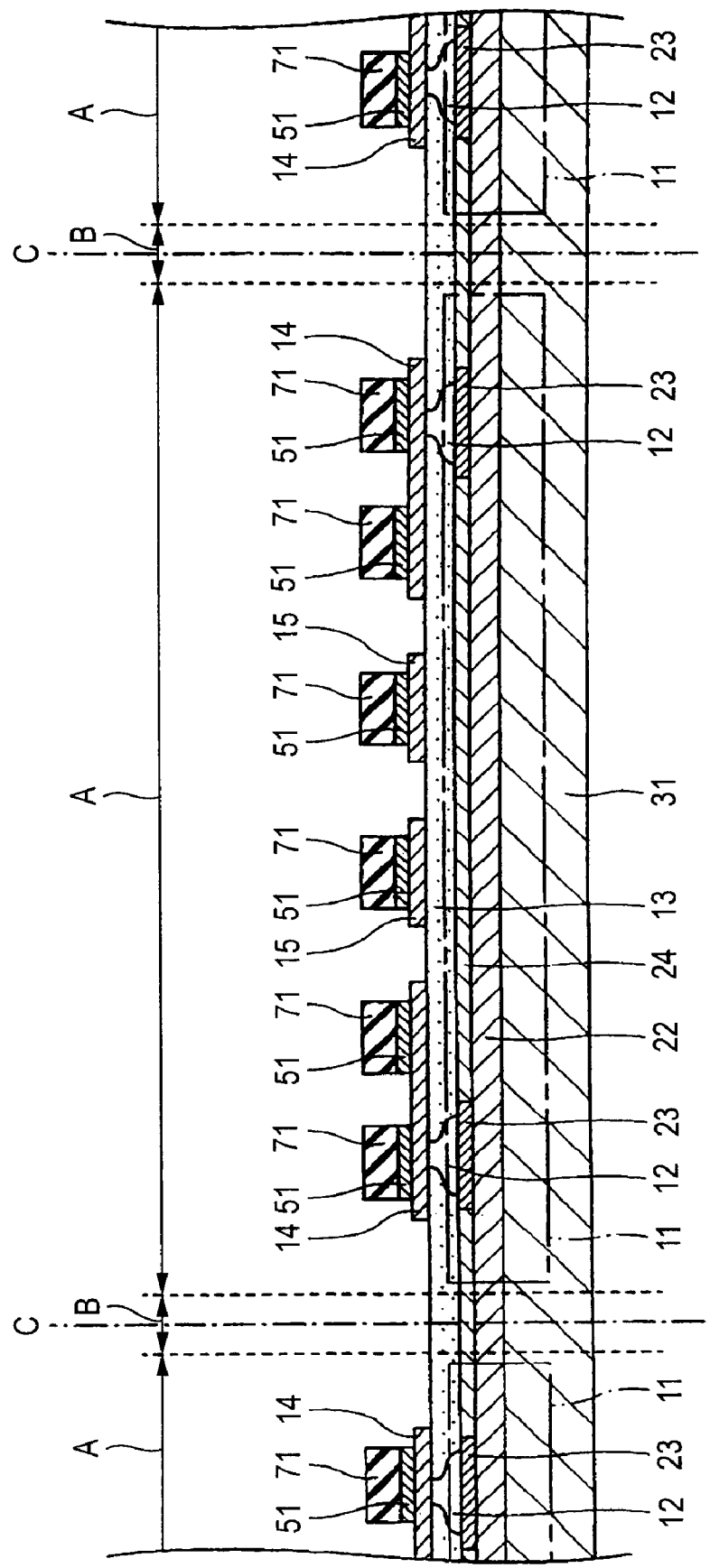
FIG. 47 shows a manufacturing process step (No. 9) of the semiconductor device according to the fourth embodiment of the invention.
Figure 48:
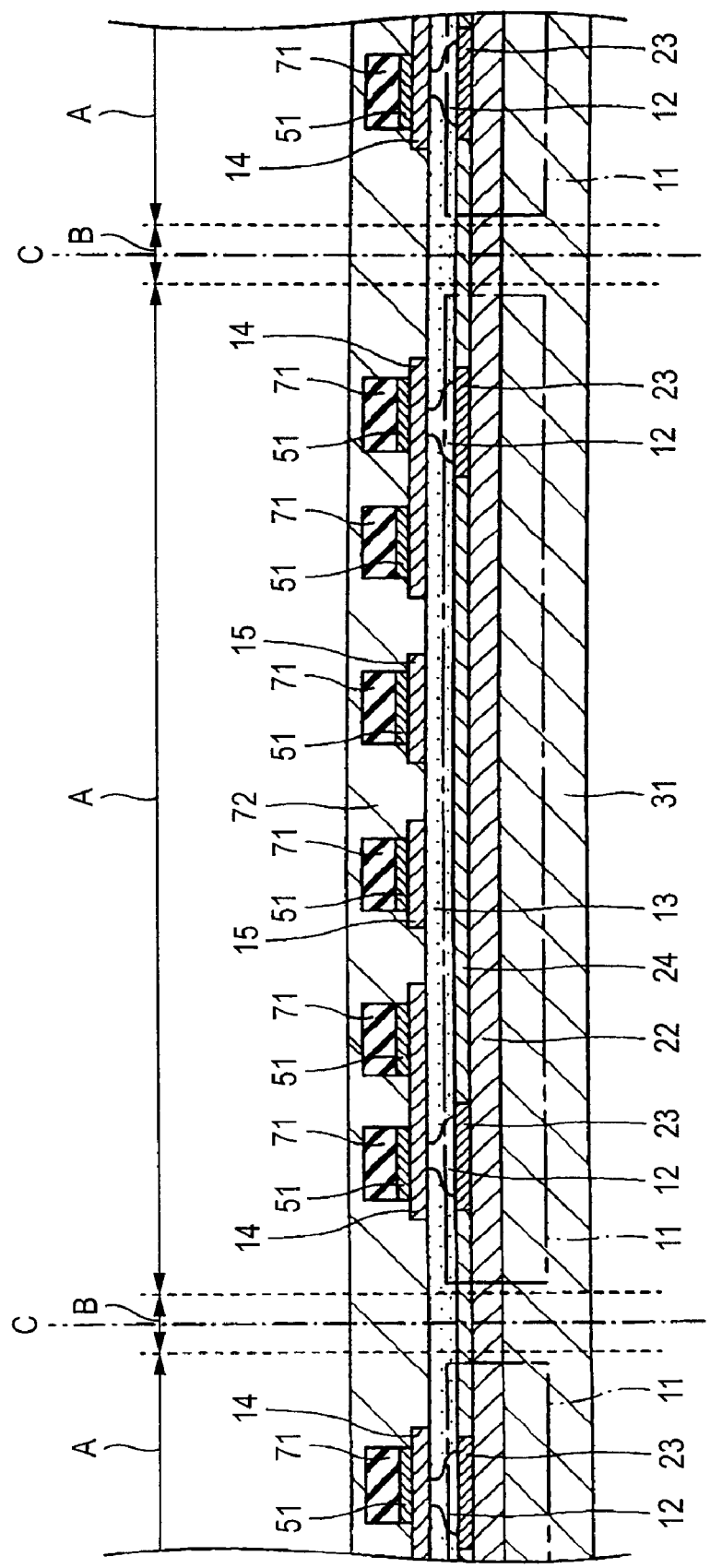
FIG. 48 shows a manufacturing process step (No. 10) of the semiconductor device according to the fourth embodiment of the invention.

Next, in a process step shown in FIG. 48, an encapsulation resin 72 is formed so as to cover the top surface of the structure shown in FIG. 47. The encapsulation resin 72 may for example be formed by a transfer molding method or a compression molding method. As for the encapsulation resin 72, an epoxy resin may for example be used.

Next, in a process step shown in FIG. 49, excess portion of the encapsulation resin 72 is eliminated to make top surfaces 71A of the metal posts 71 approximately flush with the top surface 72A of the encapsulation resin 72. More specifically, the excess portion of the encapsulation resin 72 is eliminated by plasma ashing, for example.

Thereafter, by performing process steps similar to those shown in FIGS. 20 through 22 explained with reference to the first embodiment, a plurality of semiconductor devices 70 are completed.

According to the present embodiment of the manufacturing method of the semiconductor device, after the formation of the insulating resin 13 so as to cover the plurality of internal connection terminals 12 and a surface of the plurality of semiconductor chips 11 on which the internal connection terminals 12 are formed, by sequentially forming the first metal layer 54, which is intended for the wiring patterns 14, 15, the second metal layer 55 and the third metal layer 74 over the insulating resin 13, and pressing the third metal layer 74 to pressure-bond the first metal layer 54 and the plurality of the internal connection terminals 12, the process to align the heights of the plurality of internal connection terminals 12, and the process to grind the insulating resin 13 to expose portions of the plurality of internal connection terminals 12 from the insulating resin 13 may be unnecessitated, so that the number of process steps may be reduced, allowing reduction in the manufacturing cost of the semiconductor device 70.

Furthermore, by forming the metal posts 71 between the external connection terminals 17 and the connection pads 51, stress (force) applied to the external connection terminals 17 may be alleviated.

The semiconductor devices 70 of the present embodiment is explained as having the insulating resin 13 formed between the wiring patterns 14, 15 and the semiconductor chips 11, however, the anisotropic conductive resin 41 explained in the second embodiment may be provided in the place of the insulating resin 13. In this case, the effects similar to those obtained by the manufacturing method of the semiconductor device 40 according to the second embodiment may be obtained.

In each embodiment, if the semiconductor substrate is a wafer having a diameter of 8 inch, the object of the present invention is realized by applying a pressure of 11,000 kg or more at 150° C. to 200° C. in the pressure bonding process.

Although preferred embodiments of the invention are explained heretofore, the present invention is not limited to any of the particular embodiments disclosed, and various changes and modifications may be possible within the scope and spirit of the invention described in the claims.

The invention is applicable to a manufacturing method of a semiconductor device having a size approximately same as the size of a semiconductor chip when viewed in a plan view, in which the semiconductor chip is flip-chip bonded to a wiring pattern.

What is claimed is:

1. A manufacturing method of a semiconductor device comprising a semiconductor substrate on which a plurality of semiconductor chips are formed, the plurality of semiconductor chips having electrode pads, internal connection terminals provided on the electrode pads and wiring patterns connected to the internal connection terminals, the method comprising:
   an insulating resin formation process for forming an insulating resin so as to cover the internal connection terminals and a surface of the plurality of semiconductor chips on which the internal connection terminals are provided;
   a metal layer formation process for forming a metal layer on the insulating resin;
   a pressure bonding process for pressure-bonding the metal layer and the internal connection terminals by pressing the metal layer and simultaneously aligning heights of the internal connection terminals; and
   a wiring pattern formation process for forming the wiring patterns by etching the metal layer after the pressure bonding process.

2. The manufacturing method of semiconductor devices comprising a semiconductor substrate on which a plurality of semiconductor chips are formed, the plurality of semiconductor chips having electrode pads, internal connection terminals provided on the electrode pads and wiring patterns connected to the internal connection terminals, the method comprising:

an insulating resin formation process for forming an insulating resin so as to cover the internal connection terminals and a surface of the plurality of semiconductor chips on which the internal connection terminals are provided;

a metal layer lamination process for sequentially laminating a first metal layer and a second metal layer on the insulating resin;

a pressure bonding process for pressure-bonding the first metal layer and the internal connection terminals by pressing the second metal layer;

a connection pad formation process for forming connection pads by etching the second metal layer after the pressure bonding process; and a wiring pattern formation process for forming the wiring pattern by etching the exposed first metal layer.

3. The manufacturing method of semiconductor devices as in claim 2, wherein the first metal layer is an etching stopper for etching the second metal layer.

4. A manufacturing method of a semiconductor device comprising a semiconductor substrate on which a plurality of semiconductor chips are formed, the plurality of semiconductor chips having electrode pads, internal connection terminals provided on the electrode pads and wiring patterns connected to the internal connection terminals, the method comprising:

an insulating resin formation process for forming an insulating resin so as to cover the internal connection terminals and a surface of the plurality of semiconductor chips on which the internal connection terminals are provided;

a layer lamination process for sequentially laminating a first metal layer, a second metal layer and a protective layer for protecting the second metal layer on the insulating resin;

a pressure bonding process for pressure-bonding the first metal layer and the internal connection terminals by pressing the protective layer after the layer lamination process;

a protective layer elimination process for eliminating the protective layer after the pressure bonding process;

a connection pad formation process for forming connection pads by etching the second metal layer; and a wiring pattern formation process for forming the wiring patterns by etching the first metal layer.

5. The manufacturing method of a semiconductor device as in claim 4, wherein the first metal layer is an etching stopper for etching the second metal layer.

6. A manufacturing method of a semiconductor device comprising a semiconductor substrate on which a plurality of semiconductor chips are formed, the plurality of semiconductor chips having electrode pads, internal connection terminals provided on the electrode pads and wiring patterns connected to the internal connection terminals, the method comprising:

an insulating resin formation process for forming an insulating resin so as to cover the internal connection terminals and a surface of the plurality of semiconductor chips on which the internal connection terminals are provided;

a metal layer lamination process for sequentially laminating a first metal layer, a second metal layer and a third metal layer on the insulating resin;

a pressure bonding process for pressure-bonding the first metal layer and the internal connection terminals by pressing the third metal layer;

a metal post formation process for forming metal posts by etching the third metal layer after the pressure bonding process;

a connection pad formation process for forming connection pads by etching the second metal layer; and a wiring pattern formation process for forming the wiring patterns by etching the first metal layer.

7. The manufacturing method of a semiconductor device as in claim 6, wherein the second metal layer is an etching stopper for etching the third metal layer.

8. The manufacturing method of a semiconductor device as in claim 6, wherein the first metal layer is an etching stopper for etching the second metal layer.

9. A manufacturing method of a semiconductor device comprising a semiconductor substrate on which a plurality of semiconductor chips are formed, the plurality of semiconductor chips having electrode pads, internal connection terminals provided on the electrode pads and wiring patterns connected to the internal connection terminals, the method comprising:

an anisotropic conductive resin formation process for forming an anisotropic conductive resin so as to cover the internal connection terminals and a surface of the plurality of semiconductor chips on which the internal connection terminals are provided;

a metal layer formation process for forming a metal layer on the anisotropic conductive resin;

a pressure bonding process for pressure-bonding the metal layer and the internal connection terminals by pressing the metal layer; and a wiring pattern formation process for forming the wiring patterns by etching the metal layer after the pressure bonding process.

10. A manufacturing method of a semiconductor device comprising a semiconductor substrate on which a plurality of semiconductor chips are formed, the plurality of semiconductor chips having electrode pads, internal connection terminals provided on the electrode pads and wiring patterns connected to the internal connection terminals, the method comprising;

an anisotropic conductive resin formation process for forming an anisotropic conductive resin so as to cover the internal connection terminals and a surface of the plurality of semiconductor chips on which the internal connection terminals are provided;

a metal layer lamination process for sequentially laminating a first metal layer and a second metal layer on the anisotropic conductive resin;

a pressure bonding process for pressure-bonding the first metal layer and the internal connection terminals by pressing the second metal layer;

a connection pad formation process for forming connection pads by etching the second metal layer after the pressure bonding process; and a wiring pattern formation process for forming the wiring patterns by etching the first metal layer.

11. The manufacturing method of a semiconductor device as in claim 10, wherein the first metal layer is an etching stopper for etching the second metal layer.

12. A manufacturing method of a semiconductor device comprising a semiconductor substrate on which a plurality of semiconductor chips are formed, the plurality of semiconductor chips having electrode pads, internal connection terminals provided on the electrode pads and wiring patterns connected to the internal connection terminals, the method comprising:

an anisotropic conductive resin formation process for forming an anisotropic conductive resin so as to cover the internal connection terminals and a surface of the plurality of semiconductor chips on which the internal connection terminals are provided;

a layer lamination process for sequentially laminating a first metal layer, a second metal layer and a protective layer for protecting the second metal layer on the anisotropic conductive resin;

a pressure bonding process for pressure-bonding the first metal layer and the internal connection terminals by pressing the protective layer after the layer lamination process;

a protective layer elimination process for eliminating the protective layer after the pressure bonding process;

a connection pad formation process for forming connection pads by etching the second metal layer; and a wiring pattern formation process for forming the wiring patterns by etching the first metal layer.

13. The manufacturing method of a semiconductor device as in claim 12, wherein the first metal layer is an etching stopper for etching the second metal layer.

14. A manufacturing method of a semiconductor device comprising a semiconductor substrate on which a plurality of semiconductor chips are formed, the plurality of semiconductor chips having electrode pads, internal connection terminals provided on the electrode pads and wiring patterns connected to the internal connection terminals, the method comprising:

an anisotropic conductive resin formation process for forming an anisotropic conductive resin so as to cover the internal connection terminals and a surface of the plurality of semiconductor chips on which the internal connection terminals are provided;

a metal layer lamination process for sequentially laminating a first metal layer, a second metal layer and a third metal layer on the anisotropic conductive resin;

a pressure bonding process for pressure-bonding the first metal layer and the internal connection terminals by pressing the third metal layer;

a metal post formation process for forming metal posts by etching the third metal layer after the pressure bonding process;

a connection pad formation process for forming connection pads by etching the second metal layer; and a wiring pattern formation process for forming the wiring patterns by etching the first metal layer.

15. The manufacturing method of a semiconductor device as in claim 14, wherein the second metal layer is an etching stopper for etching the third metal layer.

16. The manufacturing method of a semiconductor device as in claim 14, wherein the first metal layer is an etching stopper for etching the second metal layer.

17. The manufacturing method of semiconductor devices as in claim 1, wherein pressure applied to the metal layer during the pressure bonding process is greater than atmospheric pressure.

18. The manufacturing method of semiconductor devices as in claim 1, wherein greater than 11,000 kilograms is applied to the metal layer during the pressure bonding process.

19. The manufacturing method of semiconductor devices as in claim 2, wherein pressure applied to the second metal layer during the pressure bonding process is greater than atmospheric pressure.

20. The manufacturing method of semiconductor devices as in claim 2, wherein greater than 11,000 kilograms is applied to the second metal layer during the pressure bonding process.

* * * * *

UNITED STATES PATENT AND TRADEMARK OFFICE
CERTIFICATE OF CORRECTION

PATENT NO.       : 7,749,889 B2         Page 1 of 1
APPLICATION NO.  : 11/856360
DATED            : July 6, 2010
INVENTOR(S)      : Yamano et al.

It is certified that error appears in the above-identified patent and that said Letters Patent is hereby corrected as shown below:

In Column 20, Line 64, in Claim 2, delete "The" and insert -- A --, therefor.

In Column 20, Line 64, in Claim 2, after "of" insert -- a --.

In Column 20, Line 64, in Claim 2, delete "devices" and insert -- device --, therefor.

In Column 21, Line 19, in Claim 3, after "of" insert -- a --.

In Column 21, Line 19, in Claim 3, delete "devices" and insert -- device --, therefor.

In Column 22, Line 41, in Claim 10, delete "comprising;" and insert -- comprising: --, therefor.

In Column 24, Line 19, in Claim 17, after "of" insert -- a --.

In Column 24, Line 19, in Claim 17, delete "devices" and insert -- device --, therefor.

In Column 24, Line 24, in Claim 18, after "of" insert -- a --.

In Column 24, Line 24, in Claim 18, delete "devices" and insert -- device --, therefor.

In Column 24, Line 28, in Claim 19, after "of" insert -- a --.

In Column 24, Line 28, in Claim 19, delete "devices" and insert -- device --, therefor.

In Column 24, Line 32, in Claim 20, after "of" insert -- a --.

In Column 24, Line 32, in Claim 20, delete "devices" and insert -- device --, therefor.

Signed and Sealed this
Twenty-eighth Day of December, 2010

David J. Kappos
*Director of the United States Patent and Trademark Office*